US012672280B2

(12) United States Patent
Lee et al.

(10) Patent No.: US 12,672,280 B2
(45) Date of Patent: Jun. 30, 2026

(54) VERTICAL TYPE NON-VOLATILE MEMORY DEVICES AND METHODS OF FABRICATING THE SAME

(71) Applicant: Samsung Electronics Co., Ltd., Suwon-si (KR)

(72) Inventors: Ahreum Lee, Suwon-si (KR); Woosung Yang, Suwon-si (KR); Jimo Gu, Suwon-si (KR); Jaeho Kim, Suwon-si (KR); Sukkang Sung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 352 days.

(21) Appl. No.: 18/300,022

(22) Filed: Apr. 13, 2023

(65) Prior Publication Data

US 2024/0074173 A1 Feb. 29, 2024

(30) Foreign Application Priority Data

Aug. 23, 2022 (KR) ........................ 10-2022-0105781

(51) Int. Cl.
H10B 41/10 (2023.01)
H10B 41/27 (2023.01)
(Continued)

(52) U.S. Cl.
CPC ............ H10B 41/27 (2023.02); H10B 41/10 (2023.02); H10B 41/40 (2023.02); H10B 43/10 (2023.02);
(Continued)

(58) Field of Classification Search
CPC .................... H10B 41/00–70; H10B 43/00–50
See application file for complete search history.

(56) References Cited

U.S. PATENT DOCUMENTS

| | | | |
|---|---|---|---|
| 9,960,181 B1 | 5/2018 | Cui et al. | |
| 10,283,493 B1 | 5/2019 | Nishida | |
| | (Continued) | | |

FOREIGN PATENT DOCUMENTS

| | | |
|---|---|---|
| KR | 20190123880 A | 11/2019 |
| KR | 20200132570 A | 11/2020 |

OTHER PUBLICATIONS

Extended European Search Report corresponding to EP Application No. 23174357.6 (10 pages) (Feb. 6, 2024).

*Primary Examiner* — Christine S. Kim
*Assistant Examiner* — Tyler J Wiegand
(74) *Attorney, Agent, or Firm* — Wolf, Greenfield & Sacks, P.C.

(57) ABSTRACT

According to some embodiments of inventive concepts, vertical nonvolatile memory devices and related methods may reduce chip size. The nonvolatile memory device may include a substrate that includes a cell array area and an extension area. A first gate structure layer on the substrate may include a plurality of first gate layers. A second gate structure layer on the first gate structure layer and on a contact separation layer may include a plurality of second gate layers. A plurality of first metal contacts may extend through the first gate structure layer and a plurality of second metal contacts may extend through the second gate structure layer. The contact separation layer may be between the first plurality of metal contacts and the second plurality of metal contacts, and each of the second metal contacts may be aligned with a respective one of the first metal contacts.

20 Claims, 39 Drawing Sheets

(51) Int. Cl.

| | | |
|---|---|---|
| *H10B 41/40* | (2023.01) | |
| *H10B 43/10* | (2023.01) | |
| *H10B 43/27* | (2023.01) | |
| *H10B 43/40* | (2023.01) | |
| *H10B 43/50* | (2023.01) | |
| *H10W 20/41* | (2026.01) | |

(52) U.S. Cl.
CPC ............. *H10B 43/27* (2023.02); *H10B 43/40* (2023.02); *H10B 43/50* (2023.02); *H10W 20/435* (2026.01)

(56) References Cited

U.S. PATENT DOCUMENTS

| | | | |
|---|---|---|---|
| 10,453,860 B1 | 10/2019 | Xiao | |
| 10,748,924 B2 | 8/2020 | Kim | |
| 11,251,196 B2 | 2/2022 | Ahn et al. | |
| 12,394,482 B2* | 8/2025 | Kume | H01L 24/08 |
| 2019/0229125 A1* | 7/2019 | Zhou | H10B 41/27 |
| 2020/0006377 A1 | 1/2020 | Chu | |
| 2020/0098748 A1 | 3/2020 | Xiao et al. | |
| 2020/0365617 A1* | 11/2020 | Ahn | H10B 43/10 |
| 2021/0005593 A1* | 1/2021 | Lee | H01L 25/18 |
| 2021/0257298 A1 | 8/2021 | Xu et al. | |
| 2021/0384218 A1 | 12/2021 | Baek | |

* cited by examiner

VERTICAL TYPE NON-VOLATILE MEMORY DEVICES AND METHODS OF FABRICATING THE SAME

CROSS-REFERENCE TO RELATED APPLICATION

This application is based on and claims priority under 35 U.S.C. § 119 to Korean Patent Application No. 10-2022-0105781, filed on Aug. 23, 2022, in the Korean Intellectual Property Office, the disclosure of which is hereby incorporated by reference herein in its entirety.

BACKGROUND

The present disclosure relates to nonvolatile memory devices and methods of manufacturing the same, and more particularly, to nonvolatile memory devices having vertical channel structures to increase integration and methods of manufacturing the same.

Apparatuses using nonvolatile memory devices are increasing. For example, MP3 players, digital cameras, mobile phones, camcorders, flash cards, and solid-state disk (SSD) memories, etc., use nonvolatile memory devices for data storage. Among non-volatile memory devices, flash memory devices have a function of electrically erasing data in cells all together, and thus have been widely used as storage devices in place of hard disks. According to recent trends of high storage capacity, methods of efficiently using storage space of a flash memory may be useful. Accordingly, nonvolatile memory devices having vertical transistor structures (instead of planar transistor structures) have been proposed.

SUMMARY

According to some inventive concepts of the present disclosure, a vertical nonvolatile memory device may be configured to reduce and/or minimize the size of a chip and related methods of manufacture may also be provided.

In addition, issues addressed by some inventive concepts of the present disclosure are not limited to the above-described issues, and additional issues may be addressed as will be understood by one of ordinary skill in the art from the following disclosure.

According to some embodiments of inventive concepts, a vertical non-volatile memory device includes a substrate including a cell array area and an extension area adjacent to the cell array area and extending in a first direction parallel with respect to a face of the substrate, wherein a second direction extends parallel with respect to the face of the substrate and orthogonal with respect to the first direction. A vertical channel structure extends away from the substate in a third direction and has a first floor vertical channel structure and a second floor vertical channel structure, wherein the first floor vertical channel structure is between the second floor vertical channel structure and the substrate, and wherein the third direction is orthogonal with respect to the first and second directions. A stacked structure on the substrate includes gate electrode layers and interlayer insulating layers alternately stacked along a side wall of the vertical channel structure. A separation area extends in the first direction through the cell array area and/or the extension area and separates block units of the cell array area and/or the extension area in the second direction. A plurality of electrode pads extend in the first direction from respective ones of the gate electrode layers, and the electrode pads are arranged in a step structure in the extension area. A contact separation layer extends in a direction that is parallel with respect to the first and second directions in the extension area, wherein the contact separation layer is at a distance from the substrate that is equivalent to a distance from the substrate to a transition between the first floor and second floor vertical channel structures. First metal contacts extend in the third direction and are connected to the electrode pads in the extension area, wherein the contact separation layer separates the first metal contacts into first lower metal contacts between the substrate and the contact separation layer and first upper metal contacts with the contact separation layer between the first upper metal contacts and the substrate.

In addition, according to some other embodiments of the inventive concepts, a vertical non-volatile memory device includes a substrate wherein a cell array area and an extension area are defined on the substrate, and wherein first and second orthogonal directions are defined as being parallel with respect to a surface of the substrate. A vertical channel structure extends in a third direction from the cell array area of the substrate, wherein the vertical channel structure has a first floor vertical channel structure and a second floor vertical channel structure, and wherein the third direction is orthogonal with respect to the surface of the substrate. A stacked structure is on the cell array area of the substrate and includes gate electrode layers and interlayer insulating layers alternately stacked along a side wall of the vertical channel structure. A plurality of electrode pads extend from respective ones of the gate electrode layers in the first direction and are arranged in a step structure in the extension area. A contact separation layer extends in the first direction in the extension area at a distance from the substrate that is equivalent to a distance from the substrate to a transition between the first floor and second floor vertical channel structures. A plurality of metal contacts extend in the third direction and are connected to electrode pads in the extension area, wherein the contact separation layer separates the metal contacts into lower metal contacts and upper metal contacts. The electrode pads include upper electrode pads connected to respective ones of the upper metal contacts and lower electrode pads connected to respective ones of the lower metal contacts. The contact separation layer is between the lower and upper electrode pads. Each of the upper electrode pads has a respective distance from the substrate so that a distance of each of the upper electrode pads from the substrate increases with increasing distance from the cell array area. Each of the lower electrode pads has a respective distance from the substrate so that a distance of each of the lower electrode pads from the substrate increases with increasing distance from the substrate.

According to still other embodiments s of inventive concepts, a method of manufacturing a vertical non-volatile memory device includes forming a first-floor mold structure on a first substrate of a first chip having a cell array area and an extension area. A plurality of first solid hole patterns are formed penetrating through the first-floor mold structure in the cell array area and in the extension area. A contact separation sacrificial layer is formed on the first-floor mold structure and on a first portion of the first solid hole patterns in the extension area. A second portion of the first solid hole patterns in the extension area are spaced apart from the contact separation sacrificial layer, and a portion of the first solid hole patterns in the cell array area are spaced apart from the contact separation sacrificial layer. A second-floor mold structure is formed on the first-floor mold structure including the first solid hole patterns and on the contact separation sacrificial layer. A plurality of second solid hole patterns are formed which penetrate through the second-floor mold structure, wherein each of the first solid hole patterns is connected to a respective one of the second solid hole patterns. The plurality of first solid hole patterns and the plurality of second solid hole patterns are removed to provide a plurality of holes extending through the first-floor and second-floor mold structures, wherein each of the holes includes a first hole extending through the first-floor mold structure and a second hole extending through the second-floor mold structure. Vertical channel structures are formed in the first and second holes in the cell array area. Contact formation sacrificial structures are formed in the first and second holes in the extension area, wherein a first portion of the contact formation sacrificial structures in the extension area extend through the contact separation sacrificial layer, and wherein a second portion of the contact formation sacrificial structures in the extension area are spaced apart from the contact separation sacrificial layer. A trench that penetrates through the second-floor mold structure is formed to expose a portion of the contact separation sacrificial layer. A contact separation layer is formed using the trench, so that the contact separation layer replaces the contact separation sacrificial layer and separates the first portion of the contact formation sacrificial structures adjacent to the contact separation layer into a plurality of first-floor contact formation sacrificial structures between the contact separation layer and the first substrate and a plurality of second-floor contact formation sacrificial structures on the contact separation layer. The trench is extended to penetrate the first-floor mold structure thereby providing a separation trench. A stacked structure is formed by replacing first interlayer sacrificial layers of the first-floor mold structure and second interlayer sacrificial layers of the second-floor mold structure with gate electrode layers using the separation trench. The second-floor contact formation sacrificial structures on the contact separation layer are replaced with respective first metal contacts in the extension area, and the contact formation sacrificial structures that are spaced apart from the contact separation layer in the extension area are replaced with second metal contacts. The first chip is bonded to a second chip having a second substrate and a peripheral circuit area so that the vertical channel structures are between the first and second substrates. The first substrate is removed after bonding the first and second chips. The first-floor contact formation sacrificial structures on the contact separation layer are replaced with third metal contacts in the extension area. A first wiring is formed connecting at least one of the third metal contacts to at least one of the second metal contacts in the extension area.

According to yet other embodiments of inventive concepts, a method of manufacturing a vertical non-volatile memory device includes forming a plurality of first hole patterns penetrating a first-floor mold structure in a cell array area of a first substrate of a first chip on which the cell array area and an extension area are defined. A contact separation sacrificial layer is formed on a portion of the extension area. A second-floor mold structure is formed on the first-floor mold structure, on the first hole patterns, and on the contact separation sacrificial layer. A plurality of second hole patterns are formed penetrating the second-floor mold structure in the cell array area, wherein each of the second hole patterns is connected to a respective one of the corresponding first hole patterns in the cell array area. Respective vertical channel structures are formed in place of the plurality of the first and second hole patterns in the cell array area. A plurality of third hole patterns are formed penetrating the first-floor mold structure, the contact separation sacrificial layer, and the second-floor mold structure in the extension area. A plurality of fourth hole patterns are formed penetrating the first-floor mold structure and the second-floor mold structure in the extension area and spaced apart from the contact separation sacrificial layer. Respective first contact formation sacrificial structures are formed in place of the third hole patterns in the extension area. Respective second contact formation sacrificial structures are formed in place of the fourth hole patterns. A trench is formed that penetrates the second-floor mold structure. A contact separation layer is formed using the trench, wherein the contact separation layer separates the first contact formation sacrificial structures into first-floor contact formation sacrificial structures between the contact separation layer and the first substrate and second-floor contact formation sacrificial structures on the contact separation layer. The trench is extended to penetrate the first-floor mold structure to form a separation trench. A stacked structure is formed by replacing interlayer sacrificial layers of the first-floor mold structure and the second-floor mold structure with gate electrode layers using the separation trench. The second-floor contact formation sacrificial structures are replaced with first metal contacts in the extension area, and replacing the second contact formation sacrificial structures with second metal contacts spaced apart from the contact separation layer, in the extension area. The first chip is bonded to a second chip having a second substrate and a peripheral circuit area so that the first and second metal contacts are between the first and second substrates. The first substrate is removed after bonding the first and second chips. The first-floor contact formation sacrificial structures are replaced with third metal contacts in the extension area after removing the substrate. Wiring is formed connecting at least one of the third metal contacts with at least one of the second metal contacts in the extension area.

According to further embodiments of inventive concepts, a method of manufacturing a vertical non-volatile memory device includes forming a plurality of first hole patterns penetrating a first-floor mold structure on a first substrate of a first chip on which a cell array area and an extension area are defined. A contact separation sacrificial layer is formed on a portion of the first-floor mold structure in the extension area and on a portion of the first hole patterns in the extension area. A second-floor mold structure is formed on the first-floor mold structure, on the first contact separation sacrificial layer, and on the first hole patterns. A plurality of second hole patterns are formed penetrating a second-floor mold structure and connected to the corresponding first hole patterns, respectively. Vertical channel structures are formed in place of the plurality of the first and second hole patterns in the cell array area, and contact formation sacrificial structures are formed in place of the plurality of first and second hole patterns in the extension area. A separation trench is formed penetrating the first-floor and second-floor mold structures. A stacked structure is formed by replacing interlayer sacrificial layers of the first-floor mold structure and the second-floor mold structure with gate electrode layers using the separation trench. A trench is formed that penetrates the second-floor mold structure to expose a portion of the contact separation sacrificial layer spaced apart from the cell array area. A contact separation layer is formed using the trench. The contact separation layer separates first ones of the contact formation sacrificial structures adjacent the contact separation layer into first-floor contact formation sacrificial structures between the contact separation layer and the first substrate and second-floor contact formation sacrificial structures on the contact separation layer. The second-floor contact formation sacrificial structures are replaced with first metal contacts in the extension area, and second ones of the contact formation sacrificial structures spaced apart from the contact separation layer are replaced with second metal contacts. The first chip is bonded to a second chip having a second substrate and a peripheral circuit area, and the first substrate is removed. The first-floor contact formation sacrificial structures are replaced with third metal contacts. Wiring is formed connecting at least one of the third metal contacts with at least one of the second metal contacts.

According to still further embodiments of inventive concepts, a non-volatile memory device includes a substrate wherein a first direction is orthogonal with respect to a surface of the substrate and wherein the substrate includes a cell array area and an extension area. A first gate structure layer is on the substrate, wherein the first gate structure layer includes a plurality of first gate layers. A contact separation layer is on the first gate structure layer on the extension area. A second gate structure layer is on the first gate structure layer and on the contact separation layer, wherein the second gate structure layer includes a plurality of second gate layers. A plurality of channel structures extend in the first direction through the first and second gate structure layers on the cell array area. A plurality of first metal contacts extend through the first gate structure layer in the first direction between the substate and the contact separation layer in the extension area. A plurality of second metal contacts extend through the second gate structure layer in the first direction in the extension area, wherein the contact separation layer is between the first plurality of metal contacts and the second plurality of metal contacts, and wherein each of the second metal contacts is aligned with a respective one of the first metal contacts in the first direction. The device also includes a plurality of first electrode pads and a plurality of second electrode pads. Each of the first electrode pads extends from a sidewall of a respective one of the first metal contacts to provide electrical coupling with a respective one of the first gate layers. Each of the second electrode pads extends from a sidewall of a respective one of the second metal contacts to provide electrical coupling with a respective one of the second gate layers.

BRIEF DESCRIPTION OF THE DRAWINGS

Embodiments of inventive concepts will be more clearly understood from the following detailed description taken in conjunction with the accompanying drawings, in which.

DETAILED DESCRIPTION OF THE EMBODIMENTS

Figure 1:
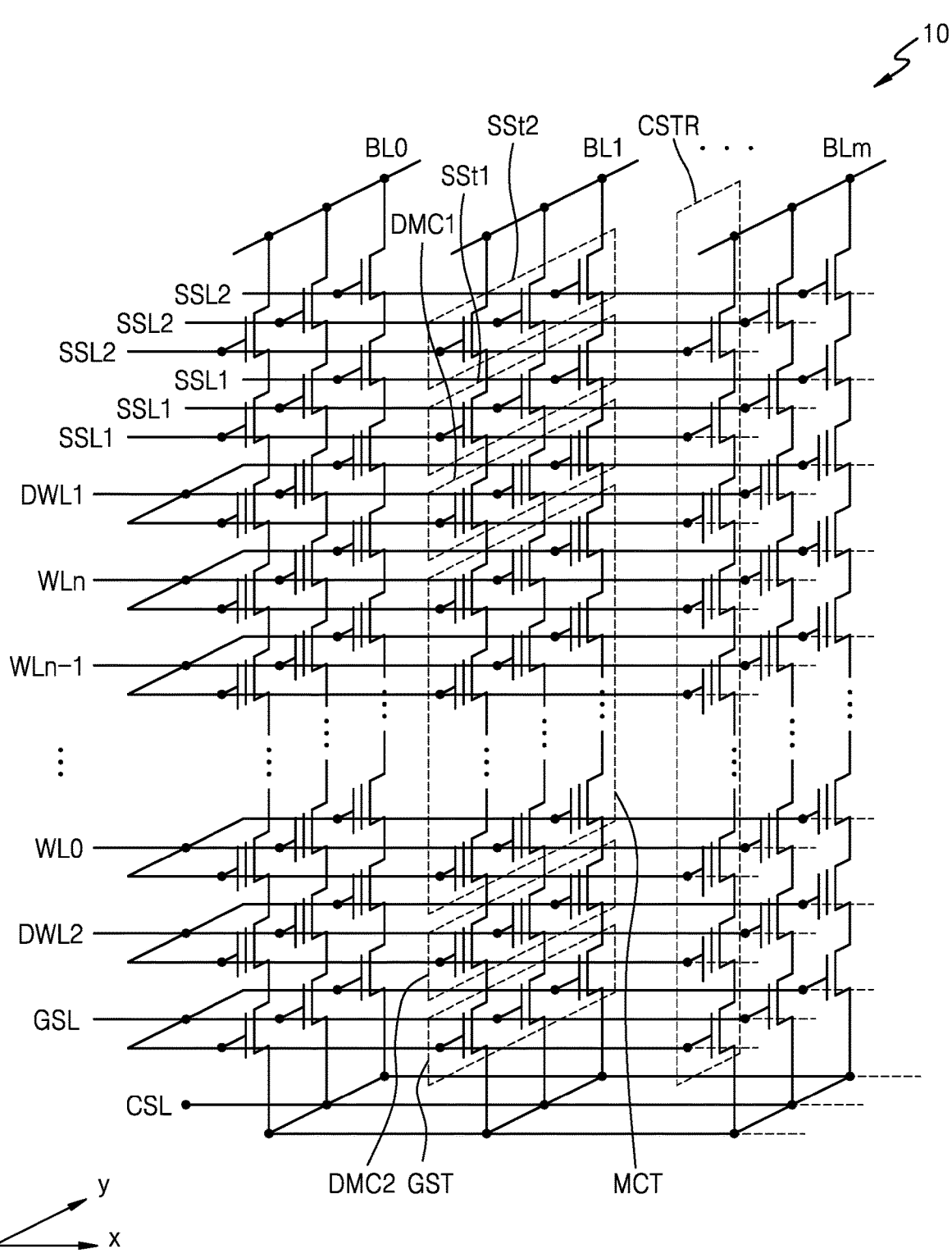
FIG. 1 is an equivalent circuit diagram of a memory cell of a vertical nonvolatile memory device, according to some embodiments of inventive concepts.

Hereinafter, embodiments of the present inventive concepts will be described in detail with reference to the accompanying drawings. The same reference numerals denote the same elements in the drawings, and duplicate descriptions on the same elements may be omitted for the sake of conciseness and/or to reduce repetition.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

It will also be understood that when an element is referred to as being "on" or "connected to" another element, it can be directly on or connected to the other element, or intervening elements may be present. In contrast, when an element is referred to as being "directly on" or "directly connected to" another element, there are no intervening elements present.

FIG. 1 illustrates an equivalent circuit diagram of a memory cell of a vertical nonvolatile memory device, according to some embodiments of inventive concepts.

Referring to FIG. 1, a vertical nonvolatile memory device 10 according to some embodiments may include a common source line CSL, a plurality of bit lines BL0 to BLm, and a plurality of cell strings CSTR. The bit lines BL0 to BLm may be arranged in a two-dimensional shape, and a plurality of cell strings CSTR may be connected to each of the bit lines BL0 to BLm in parallel with each other. A plurality of cell strings CSTR may be commonly connected to a common source line CSL.

Each of the cell strings CSTR may include string selection transistors SSt1 and SSt2, memory cell transistors MCT, and a ground selection transistor GST. Each of the memory cell transistors MCT may include a data storage element. More particularly, the first and second string selection transistors SSt1 and SSt2 may be connected in series, and the second string selection transistor SSt2 may be connected to a corresponding bit line. The ground selection transistor GST may be connected to a common source line CSL. In addition, the memory cell transistors MCT may be connected in series between the first string selection transistor SSt1 and the ground selection transistor GST. According to some embodiments, a single string selection transistor may be provided with each of the cell strings CSTR.

As shown in FIG. 1, each of the cell strings CSTR may include a first dummy cell transistor DMC1 arranged/connected between the first string selection transistor SSt1 and a respective memory cell transistor MCT and a second dummy cell transistor DMC2 arranged/connected between the ground selection transistor GST and a respective memory cell transistor MCT. However, at least one of the first and second dummy cell transistors DMC1 and DMC2 may be omitted according to some embodiments.

As a single cell string CSTR includes a plurality of memory cell transistors MCT having different distances from the common source lines CSL, multi-layered word lines WL0 to WLn may be arranged between the common source lines CSL and the bit lines BL0 to BLm. In addition, gate electrodes of the memory cell transistors MCT, which are positioned at substantially the same distance from the common source lines CSL, may be commonly connected to one of the word lines WL0 to WLn in an equipotential state.

Figure 2A:
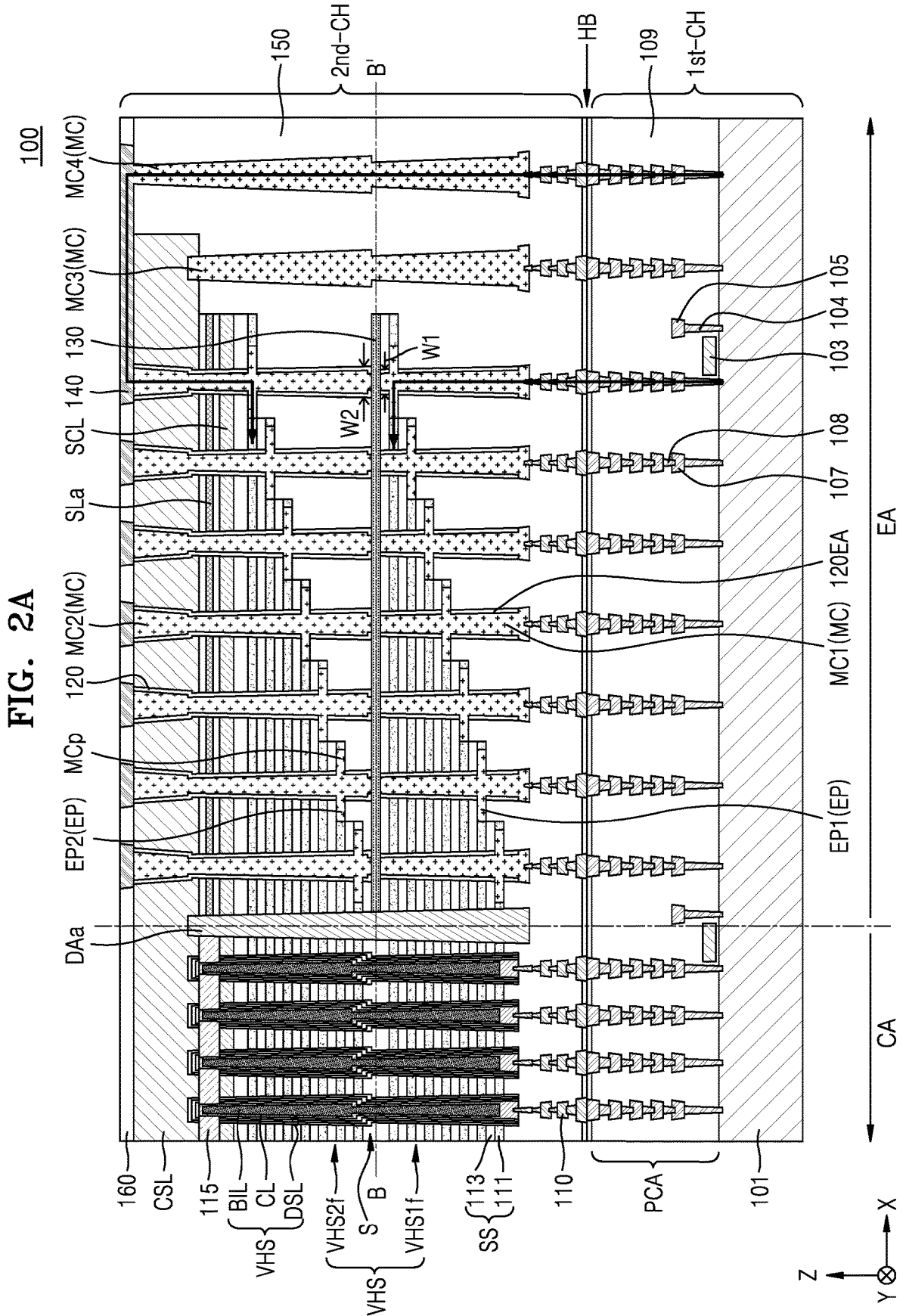
FIGS. 2A and 2B are respective cross-sectional and plan views of a vertical nonvolatile memory device according to some embodiments of inventive concepts.

The vertical nonvolatile memory device 10 of some embodiments may include a contact separation layer 130 in FIG. 2A, so that the size of an extension area EA in FIG. 2A may be significantly reduced. As the size of the extension area EA is reduced as described above, in the vertical nonvolatile memory device 10 of some embodiments, the size of the wasted extension area EA may be reduced and/or minimized in a structure in which two chips are stacked, for example, in such a configuration that a first chip (refer to as 1st-CH in FIG. 2A) may be completely buried under and/or covered by a second chip (refer to as 2nd-CH in FIG. 2A).

Figure 2B:
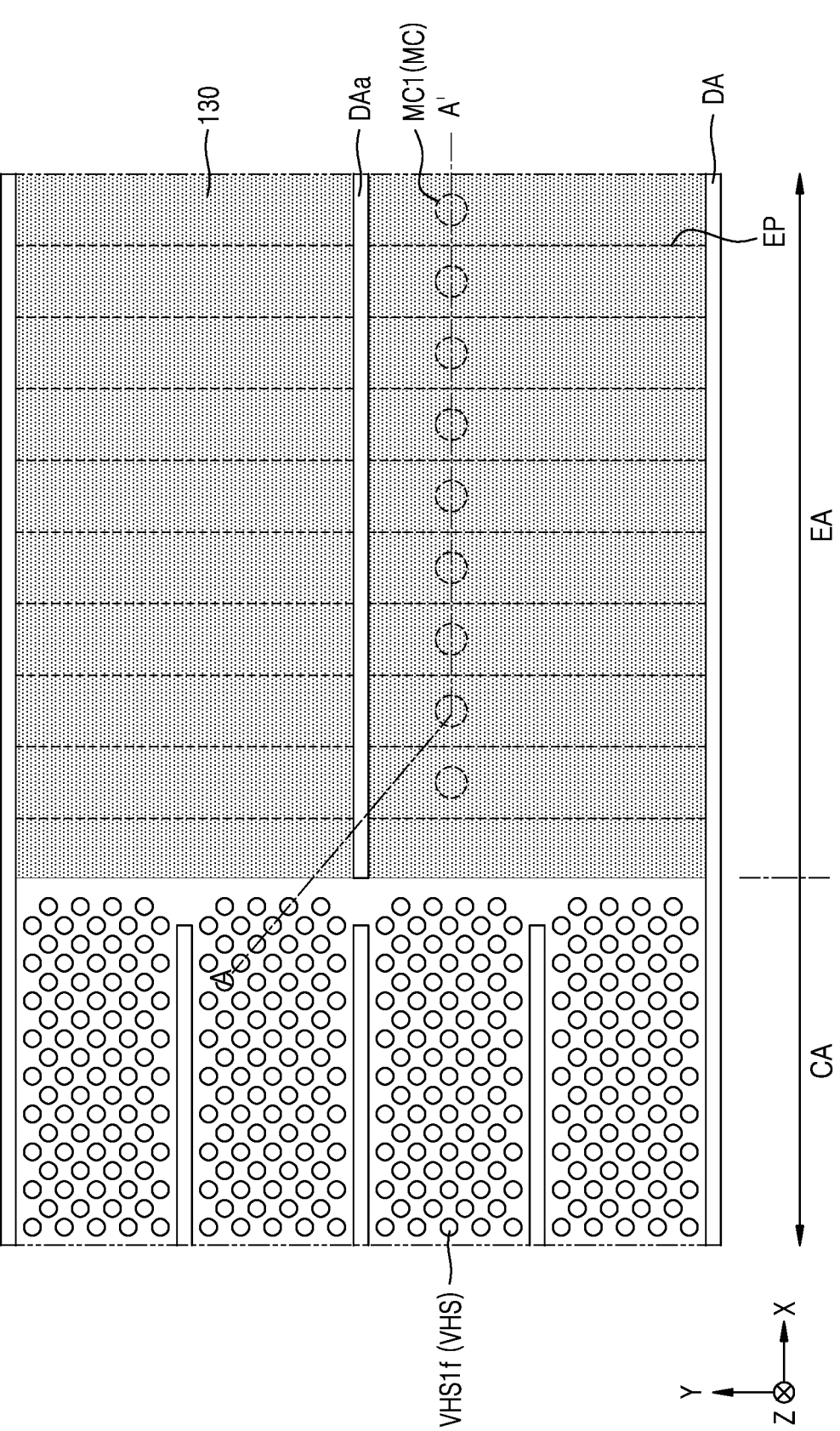

FIGS. 2A and 2B are respective cross-sectional and plan views of a vertical nonvolatile memory device, respectively, according to some embodiments. FIG. 2A is a cross-sectional view taken along section line A-A' of FIG. 2B, and FIG. 2B is a plan view illustrating a portion of section B-B' of FIG. 2A.

Referring to FIGS. 2A and 2B, the vertical nonvolatile memory device 100 according to some embodiments may include a structure in which a first chip 1st-CH and a second chip 2nd-CH are combined. The first chip 1st-CH and the second chip 2nd-CH may be combined with each other by hybrid bonding HB. Herein, hybrid bonding HB refers to a bonding structure in which copper (Cu) pads of the first chip 1st-CH and corresponding copper (Cu) pads of the second chip (2nd-CH) are bonded to each other, and an insulating layer between copper (Cu) pads of the first chip (1st-CH) and an insulating layer between copper (Cu) pads of the second chip (2nd-CH) are also bonded to each other. Herein, the insulating layer may include, for example, an oxide film such as silicon oxide ($SiO_2$) and/or a nitride film such as silicon nitride (SiNx). The vertical non-volatile memory device 100 may have a cell on (over) peri (COP) structure.

The first chip 1st-CH may include a first substrate 101 and a peripheral circuit area PCA. The first substrate 101 may include a semiconductor material, for example, a material of group IV, a compound material of group III-V, and/or an oxide material of group II-VI.

In the peripheral circuit area PCA, a high voltage and/or a low voltage transistor and a passive element(s) such as a resistor(s) and/or a capacitor(s) may be positioned. More particularly, the peripheral circuit area PCA may include a peripheral circuit gate electrode 103, a source/drain area, a peripheral circuit plug 104, a peripheral circuit wiring 105, a first wiring layer 107, and a first interlayer insulating layer 109. The first wiring layers 107 in different layers may be connected to each other through a via contact 108. The first interlayer insulating layer 109 in the first chip may be provided as a single layer structure or as multilayer structures. The first wiring layer 107 may be connected to a second wiring layer 110 of the second chip 2nd-CH by the hybrid bonding HB.

A cell array area CA and an extension area EA may be defined in the second chip 2nd-CH. In FIG. 2A, the cell array area CA and the extension area EA are shown in the first chip 1st-CH as well as the second chip 2nd-CH for the sake of convenience. However, in consideration of functional aspects, the cell array area CA and the extension area EA may be defined only in the second chip $2^{nd}$-CH.

The cell array area CA may be an area in which the string selection transistors SSt1 and SSt2, the memory cell transistor MCT, and the ground selection transistor GST of the cell string CSTR described with reference to FIG. 1 are arranged. A plurality of bit lines BL0 to BLm may be arranged on the second wiring layer 110 at a lower portion of the cell array area CA, and a common source line CSL may be arranged at an upper portion of the cell array area CA. The common source line CSL may correspond to an active area that is positioned on a substrate (refer to 101a in FIG. 5A) of the second chip $2^{nd}$-CH and doped with impurities. Since provided as a plate on the substrate 101a, the common source line CSL may be referred to as a plate common source line.

For reference, prior to the bonding the second chip 2nd-CH and the first chip 1st-CH, the second chip 2nd-CH may include the second substrate 101a and a common source line CSL, a stacked structure SS, a vertical channel structure VHS, electrode pads EP, and a second wiring layer 110 on the second substrate 101a. Thereafter, the second chip 2nd-CH may be flipped over and coupled to the first chip 1st-CH, and the second substrate 101a may be removed. Accordingly, in the vertical nonvolatile memory device 100 of some embodiments, a top and a bottom of the second chip $2^{nd}$-CH may be reversed as compared with the second chip $2^{nd}$-CH prior to coupling with the first chip $1^{st}$-CH.

The stacked structure SS may be arranged on an upper portion of the second wiring layer 110. The stacked structure SS may extend to the extension area EA from the cell array area CA in the first direction (X direction). A plurality of stacked structures SS may be arranged in the second direction (Y direction). For example, separation areas DA extending in the first direction (X direction) may be arranged in the second direction (Y direction) and spaced apart from each other, and the stacked structures SS may be separated from each other by the separation areas DA. Herein, the separation area DA is referred to as a word line cut area, and an insulating layer may be filled in the separation area DA.

As shown in FIG. 2B, at least an additional separation area DAa may be arranged in the first direction (X direction) in the cell array area CA and the extension area EA between two separation areas DA adjacent to each other in the second direction (Y direction). The additional separation area DAa may be provided to more easily perform a replacement operation for the gate electrode layer 111. For convenience, the additional separation area DAa and the separation area DA are collectively are referred to as separation area DA in the following cross-section.

The stacked structure SS may include a gate electrode layer 111 and an interlayer insulating layer 113 that are alternately and repeatedly stacked in a third direction (Z direction). A plurality of the gate electrode layers 111 may have substantially the same thickness. In contrast, a plurality of the interlayer insulating layers 113 may have different thicknesses that are variable according to characteristics of the memory device. In addition, the thickness of the interlayer insulating layer 113 may be less than that of the gate electrode layer 111. Each of the gate electrode layers 111 may be connected to the electrode pad EP in the extension area EA. For reference, a sacrificial layer SLa may be maintained on an uppermost portion of the extension area EA. In addition, a supporting conductive layer SCL may be arranged at a lower portion of the sacrificial layer SLa.

A plurality of vertical channel structures VHS may extend in the third direction (Z direction) to penetrate the stack structure SS. As can be seen from FIG. 2B, the vertical channel structures VHS may be arranged in a zigzag shape along the first direction (X direction) in a plan view. The vertical channel structure VHS may be arranged in the cell array area CA. However, the position of the vertical channel structure VHS is not limited to the cell array area CA. For example, although not shown in FIG. 2B, the vertical channel structure VHS may also be arranged in the extension area EA. Vertical channel structures VHS arranged in the extension area EA may not operate electrically and may function as a support to support the gate electrode layer 111 and the electrode pad EP. Accordingly, portions of the vertical channel structure VHS in the extension area EA may be referred to as a dummy channel structure.

The vertical channel structure VHS may include a buried insulating layer BIL, a channel layer CL, and a data storage layer DSL that are positioned in an ordered sequence from the inside thereof. As can be seen from FIG. 2A, the buried insulating layer BIL, the channel layer CL, and the data storage layer DSL may be arranged in such a configuration that portions of the buried insulating layer BIL, the channel layer CL, and the data storage layer DSL are inserted into the common source line CSL. In addition, the channel layer CL may be connected to a horizontal conductive layer 115 that is in contact with the common source line CSL. That is, the horizontal conductive layer 115 may penetrate through the data storage layer DSL at the side of the vertical channel structure VHS, to connect with the channel layer CL.

The data storage layer DSL may be arranged between the stack structure SS and the channel layer CL. The data storage layer DSL may extend in the third direction (Z direction) and surround the sidewall of the channel layer CL. The data storage layer DSL may include a single thin layer or a plurality of thin layers. In some embodiments, each data storage layer DSL may include a data storage layer of a NAND flash memory device having a tunnel insulating layer, a charge storage layer, and a blocking insulating layer.

In the vertical nonvolatile memory device 100 of some embodiments, the vertical channel structure VHS may have a two-story structure. Accordingly, the vertical channel structure VHS may include a first-floor vertical channel structure VHSf1 and a second-floor vertical channel structure VHSf2. Each of the first-floor vertical channel structure VHSf1 and the second-floor vertical channel structure VHSf2 may include the buried insulating layer BIL, the channel layer CL, and the data storage layer DSL. In addition, the first-floor vertical channel structure VHSf1 may be connected to the corresponding second-floor vertical channel structure VHSf2, and a stepped portion S may be provided in the connection portion of the first-floor and second-floor vertical channel structures VHSf1 and VHSf2. As the vertical channel structure VHS is configured to the two-story structure, the stacked structure SS surrounding the vertical channel structure VHS may also be divided into two portions. For example, the stacked structure SS may be divided into a first portion surrounding the first-floor vertical channel structure VHS1f and a second portion surrounding the second-floor vertical channel structure VHS2f.

The gate electrode layers 111 of the string selection transistors SSt1 and SSt2, the memory cell transistor MCT, and the ground selection transistor GST may extend in the first direction (X direction) from the cell array area CA, to thereby provide a plurality of electrode pads EP in the extension area EA. A metal contact MC extending in the third direction (Z direction) may be connected to the electrode pad EP. In the extension area EA, the electrode pad EP may be configured to a step structure along the first direction (X direction). Herein, the electrode pad EP is a portion of the gate electrode layer 111 to which a first metal electrode MC1 or a second metal electrode MC2 is connected, and may be defined as a protruding portion MCp of the first metal electrode MC1 or the second metal electrode MC2 and a portion of the gate electrode layer 111 that is exposed without overlapping the other gate electrode layers 111.

In the vertical nonvolatile memory device 100 of some embodiments, the contact separation layer 130 may be arranged in the extension area EA. The contact separation layer 130 may include an insulating material, for example, an oxide layer. The electrode pad EP may include a first electrode pad EP1 below the contact separation layer 130 and a second electrode pad EP2 on the contact separation layer 130. Each of the first electrode pad EP1 and the second electrode pad EP2 may have a step structure along the first direction (x direction), and the step structure of the first electrode pad EP1 may be substantially the same as that of the second electrode pad EP2. For example, the step structure of the first electrode pad EP1 and the step structure of the second electrode pad EP2 may be in such a structure that the higher the step structure is, the farther the step structure grows away from the cell array area CA in the first direction (X direction).

More particularly, the end position of a lowermost electrode pad EP1 of the first electrode pads EP1 may be substantially the same as that of a lowermost electrode pad EP2 of the second electrode pads EP2 in the first direction (X direction). In addition, the end position of an uppermost electrode pad EP1 of the first electrode pads EP1 may be substantially the same as that of an uppermost electrode pad EP2 of the second electrode pads EP2 in the first direction (X direction). However, when the number of floors of the first electrode pads EP1 and the second electrode pads EP2 is different from each other, the end position of the uppermost electrode pad EP1 of the first electrode pads EP1 may be different from that of the uppermost electrode pad EP2 of the second electrode pads EP2.

The metal contact MC may also include a first metal contact MC1 below the contact separation layer 130 and a second metal contact MC2 on the contact separation layer 130. The first metal contact MC1 may be correspondently connected to the first electrode pad EP1, and the second metal contact MC2 may be correspondently connected to the second electrode pad EP2. As illustrated in FIG. 2A, a first width W1 of an upper surface of the first metal contact MC1 making contact with the contact separation layer 130 may be smaller than a second width W2 of a lower surface of the second metal contact MC2 making contact with the contact separation layer 130. This is because the metal contact MC is formed in two penetrating holes. The metal contact MC in two penetrating holes is described in more detail in the following descriptions with reference to FIGS. 5A to 5U.

The metal contact MC may include a third metal contact MC3 and a fourth metal contact MC4 at an outer portion of the extension area EA in which the contact separation layer 130 is not provided. The third metal contact MC3 may penetrate through a planar insulating layer 150, to connect the common source line CSL and the second wiring layer 110 with each other. In addition, the fourth metal contact MC4 may penetrate through the planar insulating layer 150, to connect a third wiring layer 140 and the second wiring layer 110 with each other. As shown in FIG. 2A, the first metal contact MC1 may be directly connected to the second wiring layer 110, and the second metal contact MC2 may be connected to the second wiring layer 110 by the third wiring layer 140 and the fourth metal contact MC4. In addition, the second wiring layer 110 may be connected to the first wiring layer 107 by the hybrid bonding HB, to thereby form a signal transmission path as indicated by an arrow in FIG. 2A.

The planar insulating layer 150 may cover the stacked structure SS and the vertical channel structure VHS in the cell array area CA, and the stacked structure SS and the electrode pad EP in the extension area EA. The planar insulating layer 150 may have a substantially flat lower surface. The planar insulating layer 150 may include a single insulating layer or a plurality of insulating layers. The wiring insulating layer 160 may cover the common source line CSL, the metal contact MC, and the planar insulating layer 150. The third wiring layer 140 may be arranged in the wiring insulating layer 160. The third wiring layer 140 may connect the second metal contact MC2 to the fourth metal contact MC4.

The vertical nonvolatile memory device 100 of some embodiments may include the contact separation layer 130, so that the metal contact MC may be separated into the first metal contact MC1 below the contact separation layer 130 and the second metal contact MC2 on the contact separation layer 130, and in the same way, the electrode pad EP may be separated into the first electrode pad EP1 and the second electrode pad EP2. In addition, the first electrode pad EP1 and the second electrode pad EP2 may have substantially the same step structure. Accordingly, the first metal contact MC1 and the second metal contact MC2 may be connected to the corresponding first electrode pad EP1 and the corresponding second electrode pad EP2, which are positioned at the same position in the first direction (X direction), and at the same position in the second direction (Y direction). In other words, the first electrode pad EP1 and the second electrode pad EP2 may be arranged in such a two-story structure that the first electrode pad EP1 and the second electrode pad EP2 overlap with each other in the first direction (X direction), and in the same way, the corresponding first metal contact MC1 and second metal contact MC2 may overlap with each other in the first direction (X direction). Accordingly, the size of the extension area EA may be sufficiently reduced in the vertical nonvolatile memory device 100 of some embodiments.

In one example, comparing the size of the extension area between the vertical nonvolatile memory device of a comparative example in which the entire electrode pad is formed into the step structure in the first direction (X direction) and a vertical nonvolatile memory device of some embodiments, the size of the extension area of the comparative example is expressed as 'a size of the pad electrode*(multiplied by) a number of the gate electrode layers.' In contrast, the size of the extension area EA according to some embodiments may be expressed as 'a size of the pad electrode*(multiplied by) a number of the gate electrode layers/(divided by) 2' due to the contact separation layer 130. As described above, in a vertical nonvolatile memory device 100 of some embodiments, the size of the extension area EA may be sufficiently reduced (e.g., by a factor of 2). Accordingly, in the vertical nonvolatile memory device 100 of some embodiments, the size of the wasted extension area EA may be reduced and/or minimized in such a case that the first chip $1^{st}$-CH may be completely buried under and/or covered by the second chip $2^{nd}$-CH.

Figure 3:
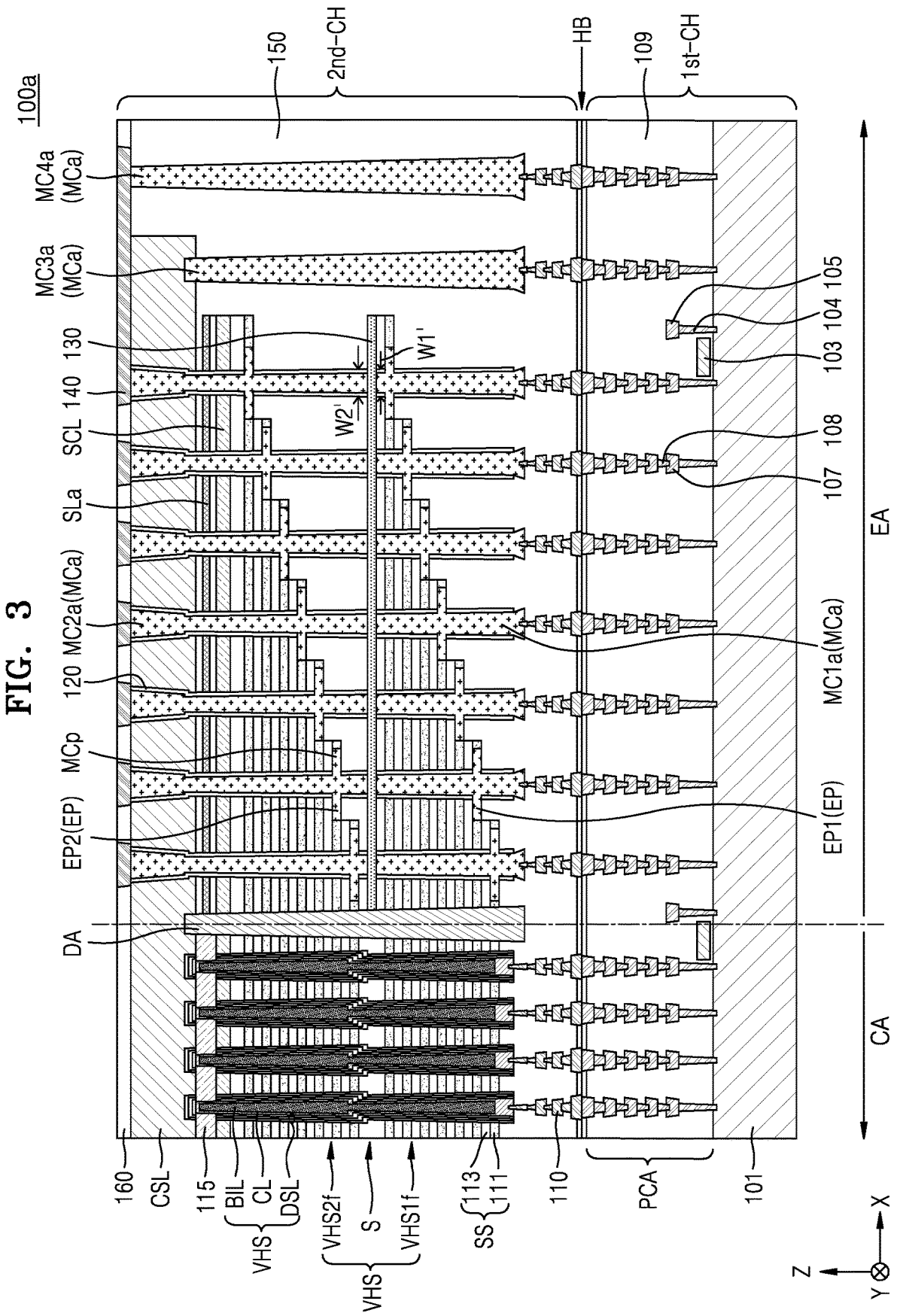
FIGS. 3 and 4 are cross-sectional views of vertical non-volatile memory devices according to some embodiments of inventive concepts.
Figure 4:
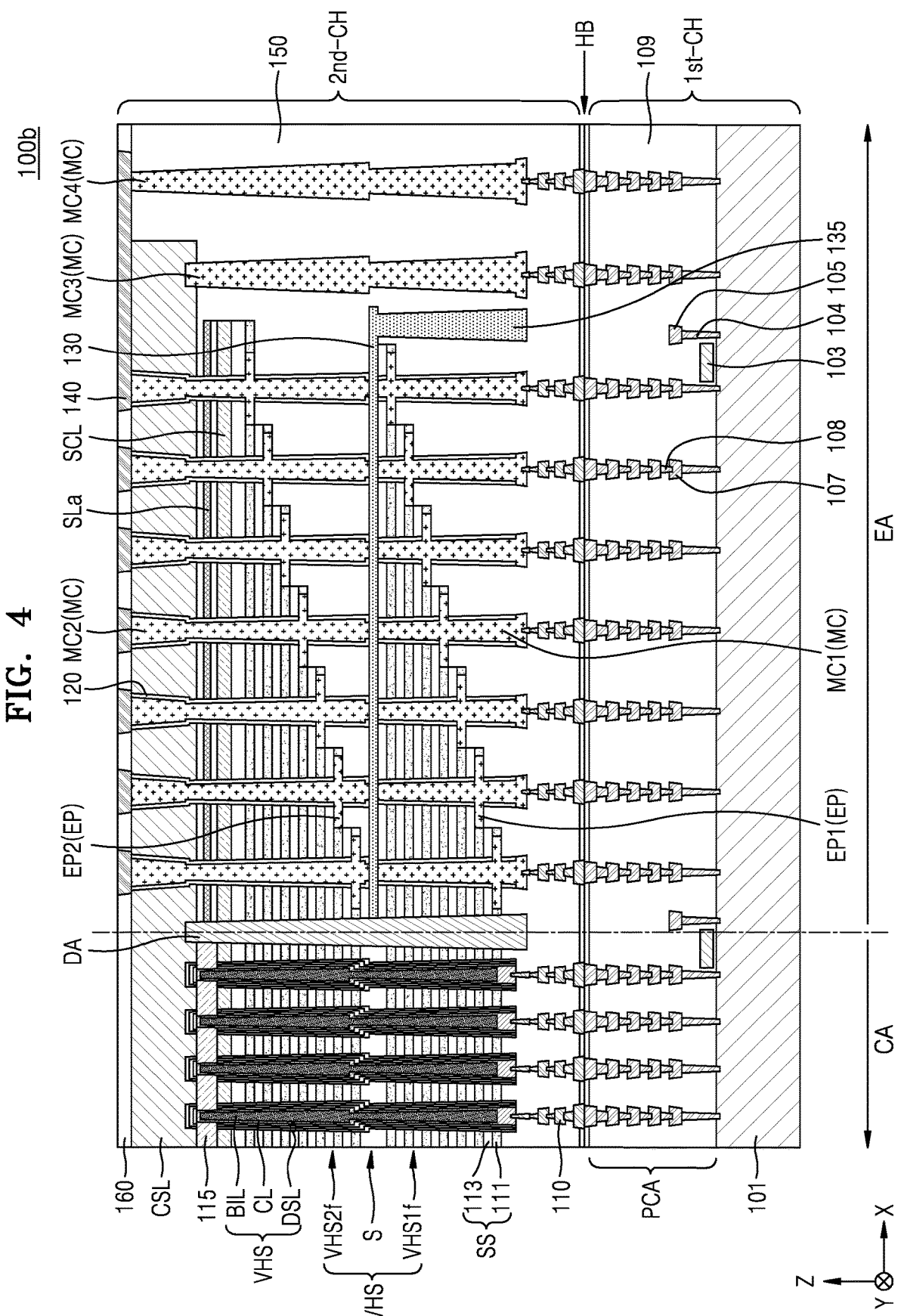

FIGS. 3 and 4 are cross-sectional views illustrating vertical nonvolatile memory devices according to some embodiments of inventive concepts. Hereinafter, the same descriptions that may be provided with reference to FIGS. 2A and 2B may be briefly given or omitted for the sake of conciseness and/or to reduce repetition.

Referring to FIG. 3, the vertical nonvolatile memory device 100a of some embodiments may be different from the vertical nonvolatile memory device 100 in FIG. 2A with respect to the structure of the metal contact MCa. More particularly, in the vertical nonvolatile memory device 100a of some embodiments, the metal contact MCa may be separated by the contact separation layer 130 in the extension area EA, and may include the first metal contact MC1a below the contact separation layer 130 and a second metal contact MC2a on the contact separation layer 130. However, in the vertical nonvolatile memory device 100a of some embodiments, a first width W1' of an upper surface of the first metal contact MC1a making contact with the contact separation layer 130 may be equal to or slightly greater than a second width W2' of a lower surface of the second metal contact MC2a making contact with the contact separation layer 130. This is because the metal contact MCa is formed in a single penetrating hole. The metal contact MCa in a single penetrating hole is described in more detail with reference to FIGS. 7A to 7F.

Referring to FIG. 4, a vertical nonvolatile memory device 100b of some embodiments may be different from the vertical nonvolatile memory device 100 in FIG. 2A in that a penetrating insulating pattern 135 is further provided. Particularly, the vertical nonvolatile memory device 100b of some embodiments may include a penetrating insulating pattern 135 that is connected to a right end portion of the contact separation layer 130 in the first direction (X direction). The penetrating insulating pattern 135 may have a length similar to that of the first metal contact MC1 and may have a structure extending in the third direction (Z direction). In addition, the material of the penetrating insulating pattern 135 may be the same as that of the contact separation layer 130. For example, the penetrating insulating pattern 135 may include an oxide layer. In the vertical nonvolatile memory device 100b of some embodiments, the contact separation layer 130 may be formed by using a trench corresponding to the penetrating insulating pattern 135. The formation of the contact separation layer 130 by using the trench is described in more detail with reference to FIGS. 8A to 8E. For reference, in the vertical nonvolatile memory device 100 in FIG. 2A, the contact separation layer 130 may be formed by using a trench corresponding to an upper portion of the separation area DA.

Figure 5A:
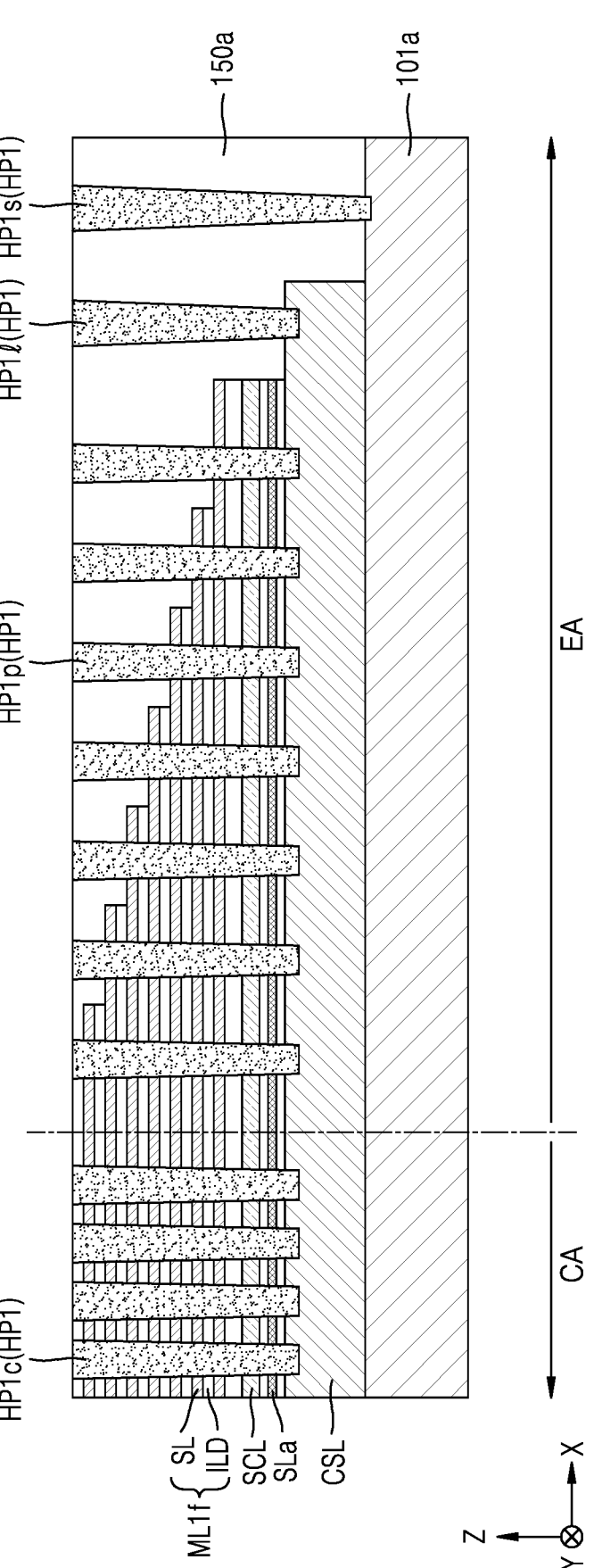
FIGS. 5A to 5U are cross-sectional views illustrating operations of manufacturing the vertical nonvolatile memory device in FIG. 2A according to some embodiments of inventive concepts.
Figure 5B:
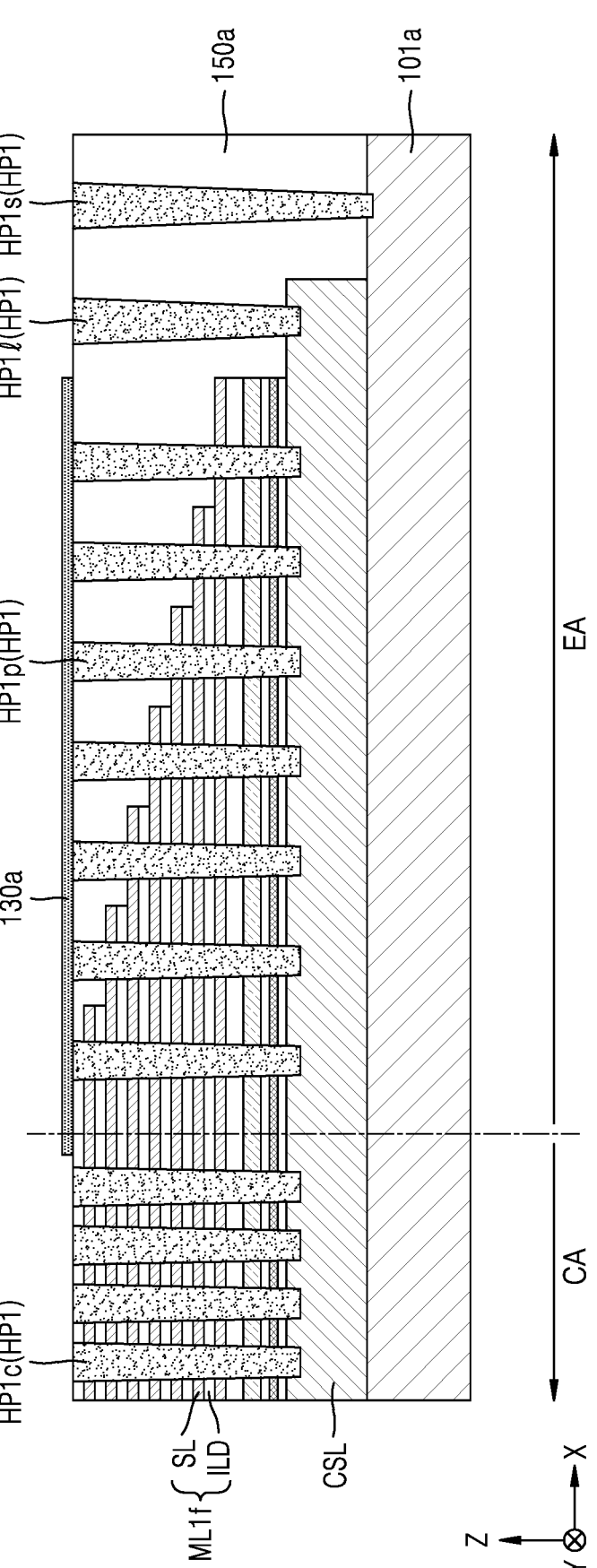
Figure 5C:
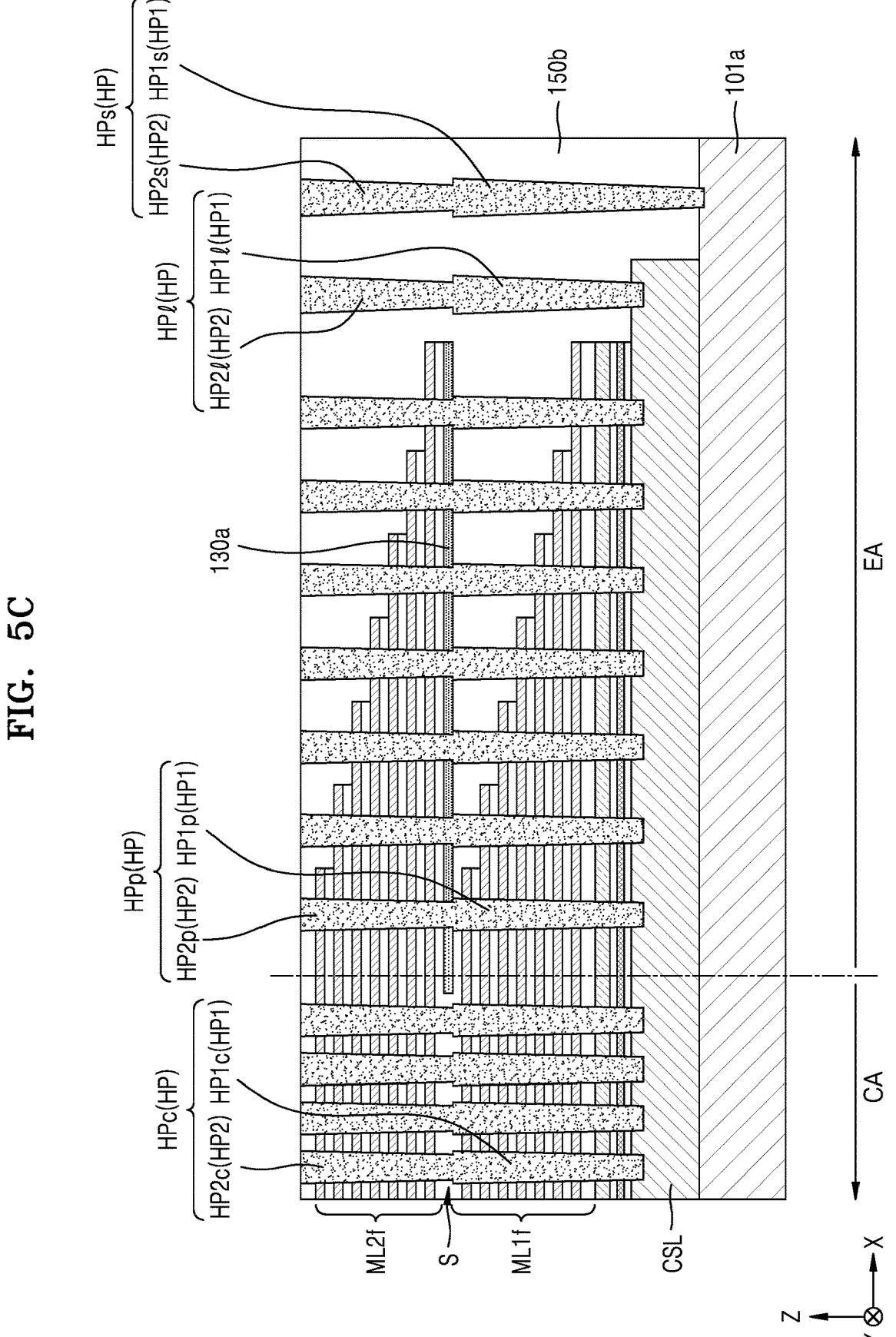
Figure 5D:
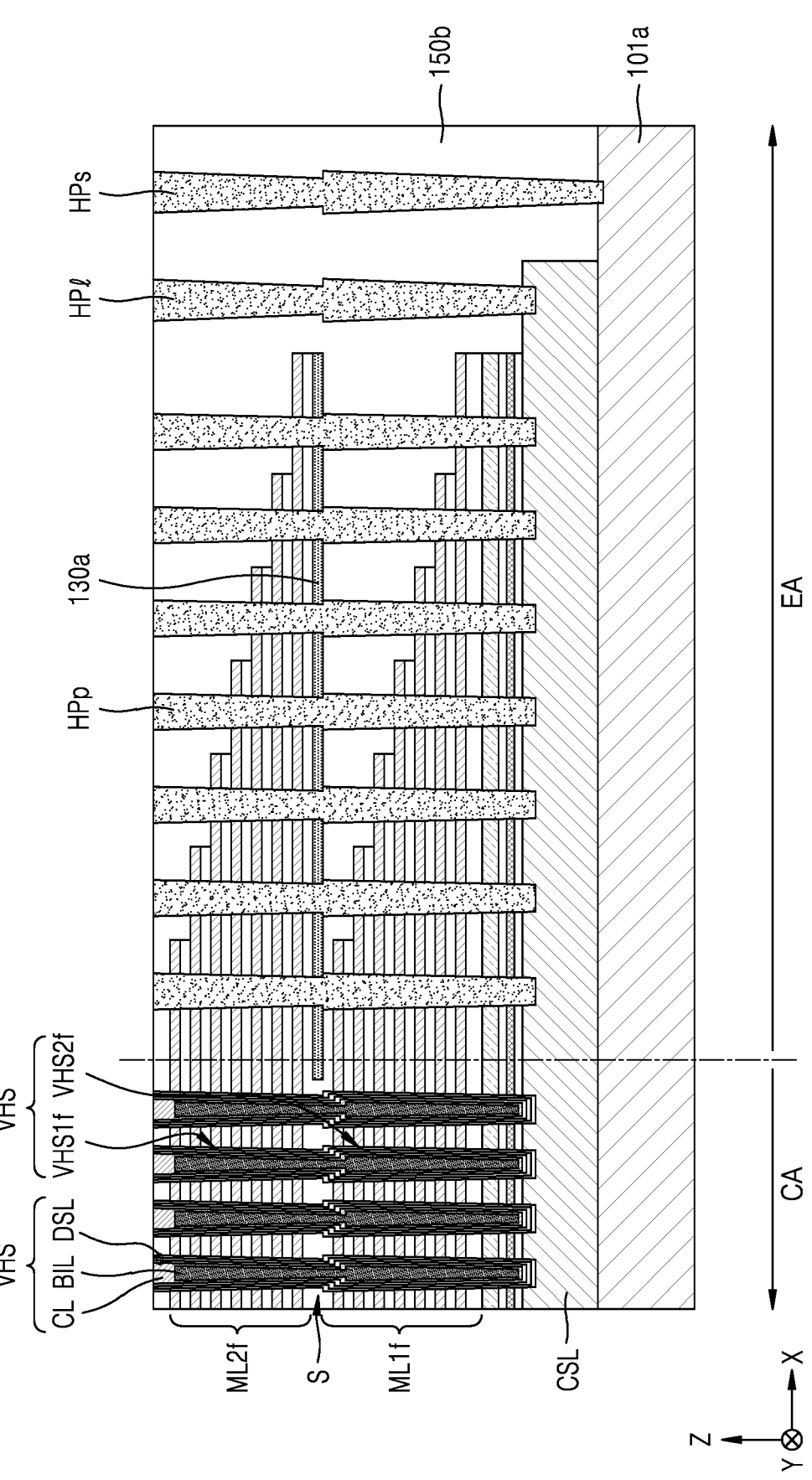
Figure 5E:
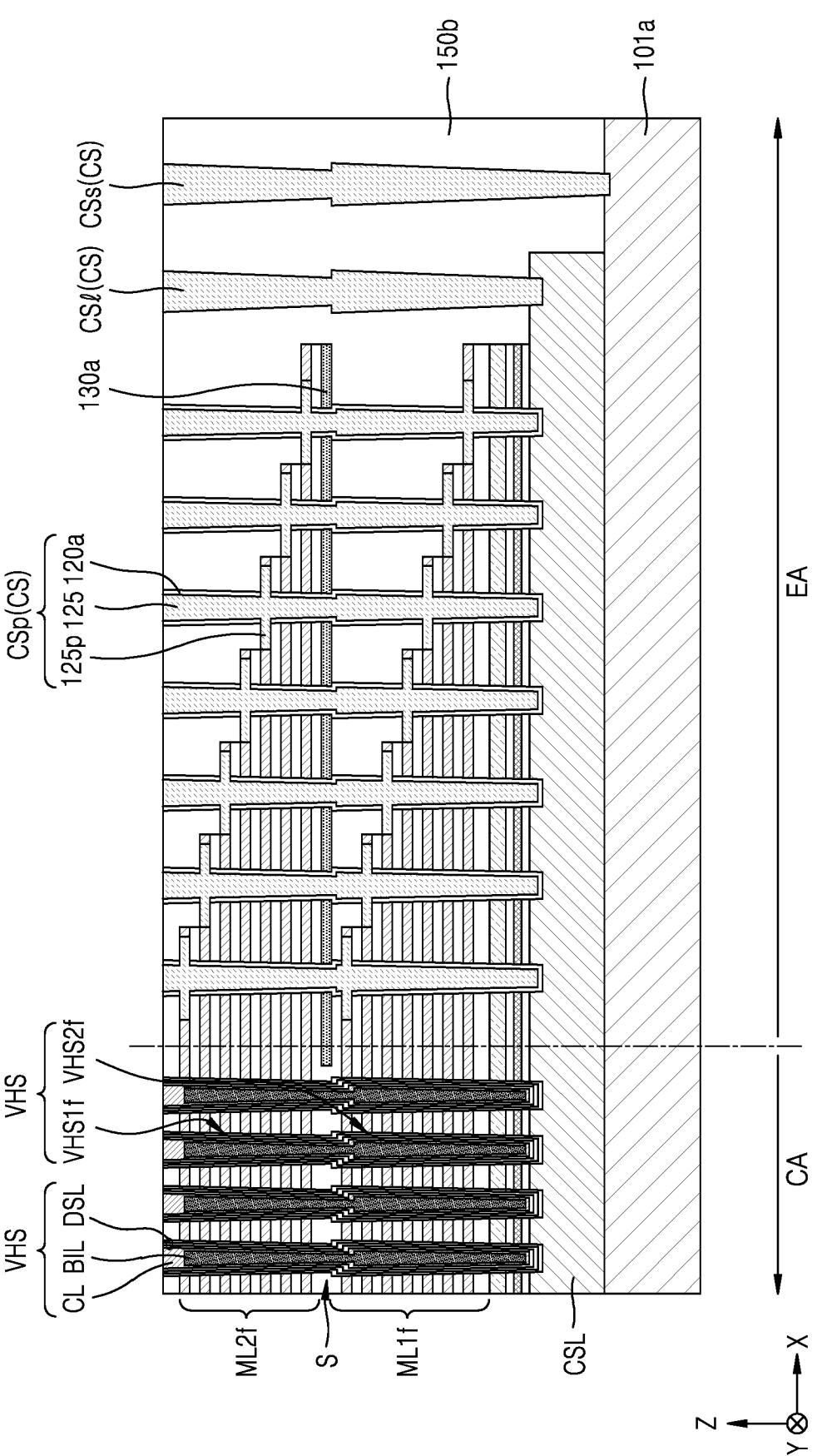
Figure 5F:
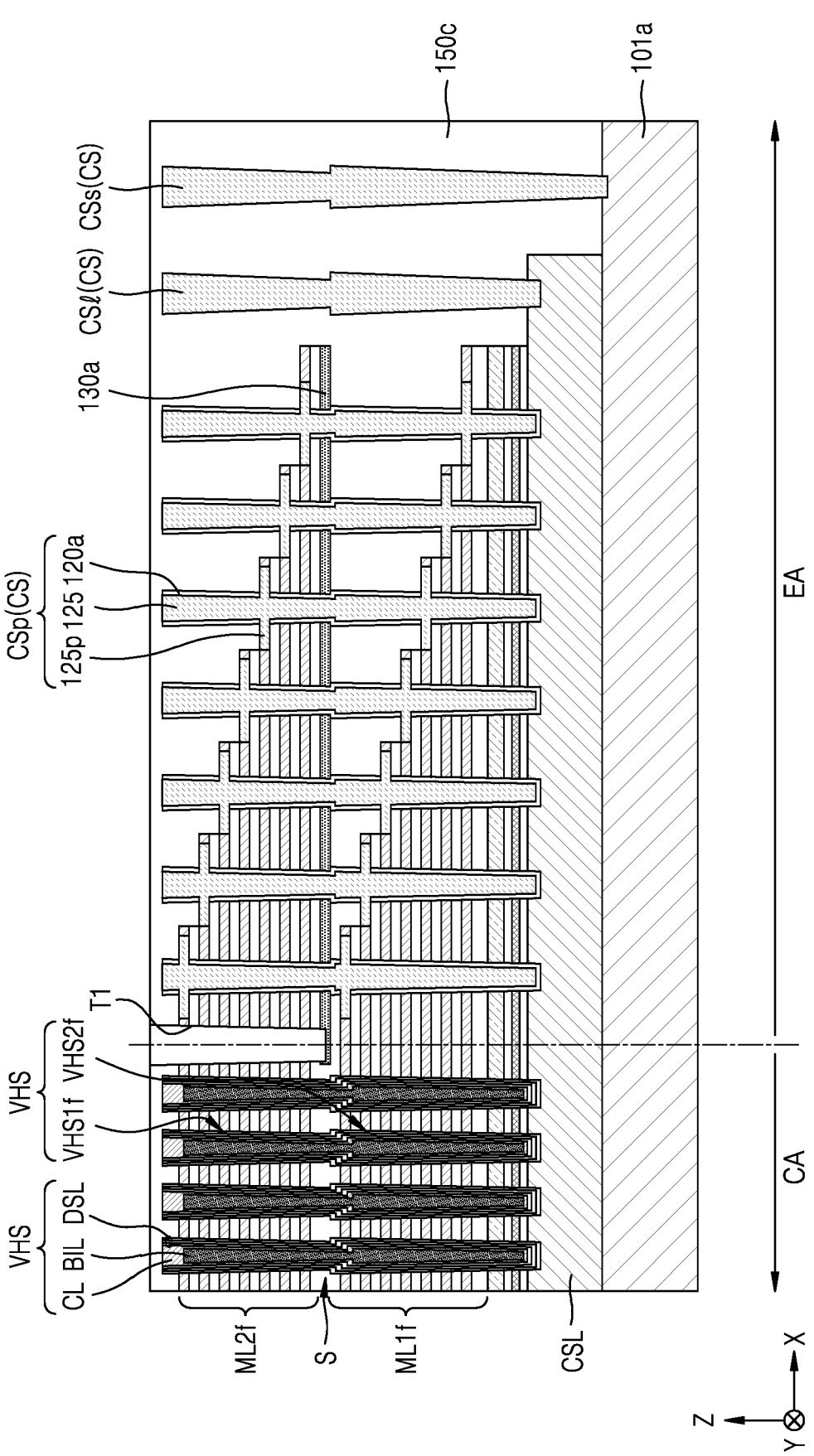
Figure 5G:
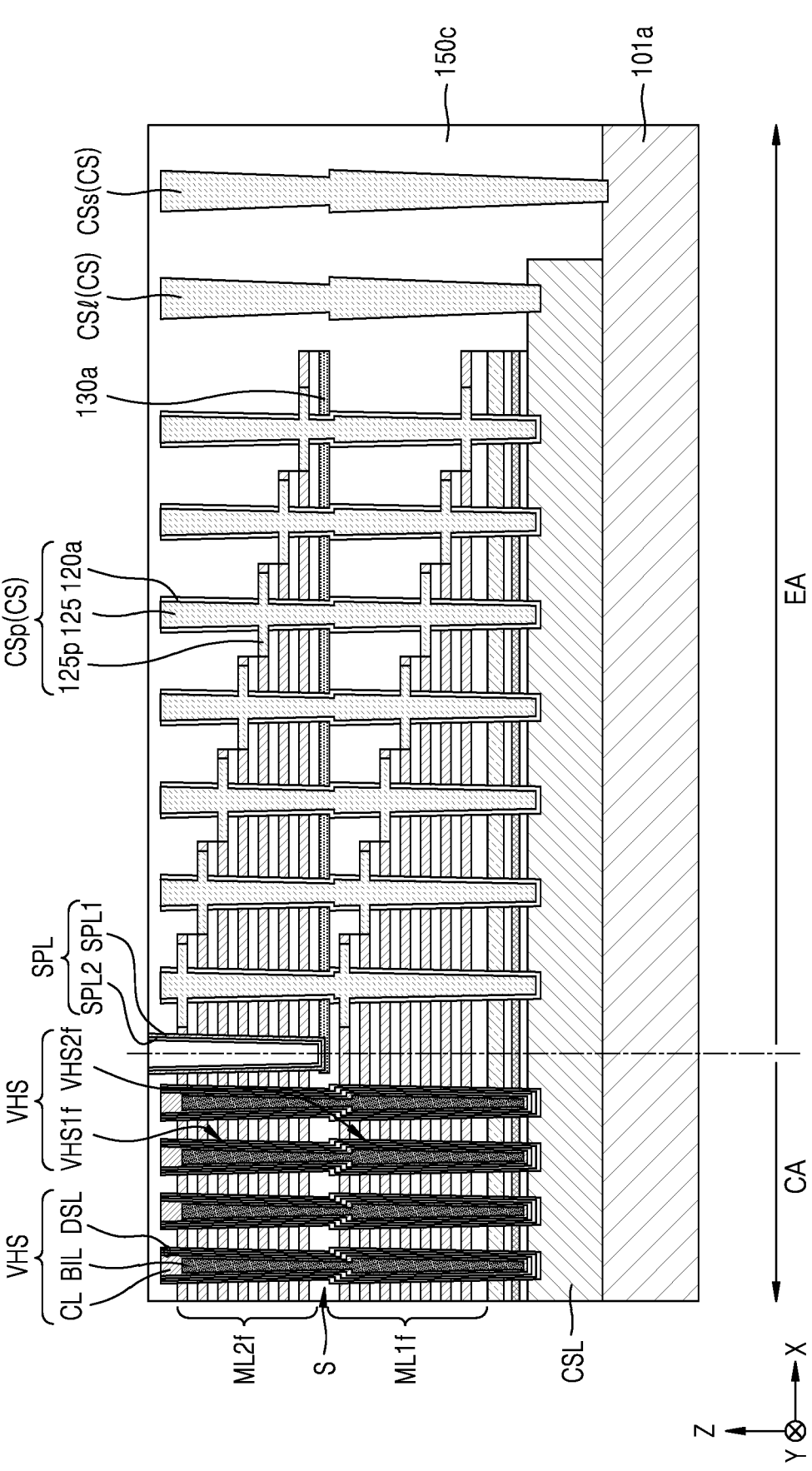
Figure 5H:
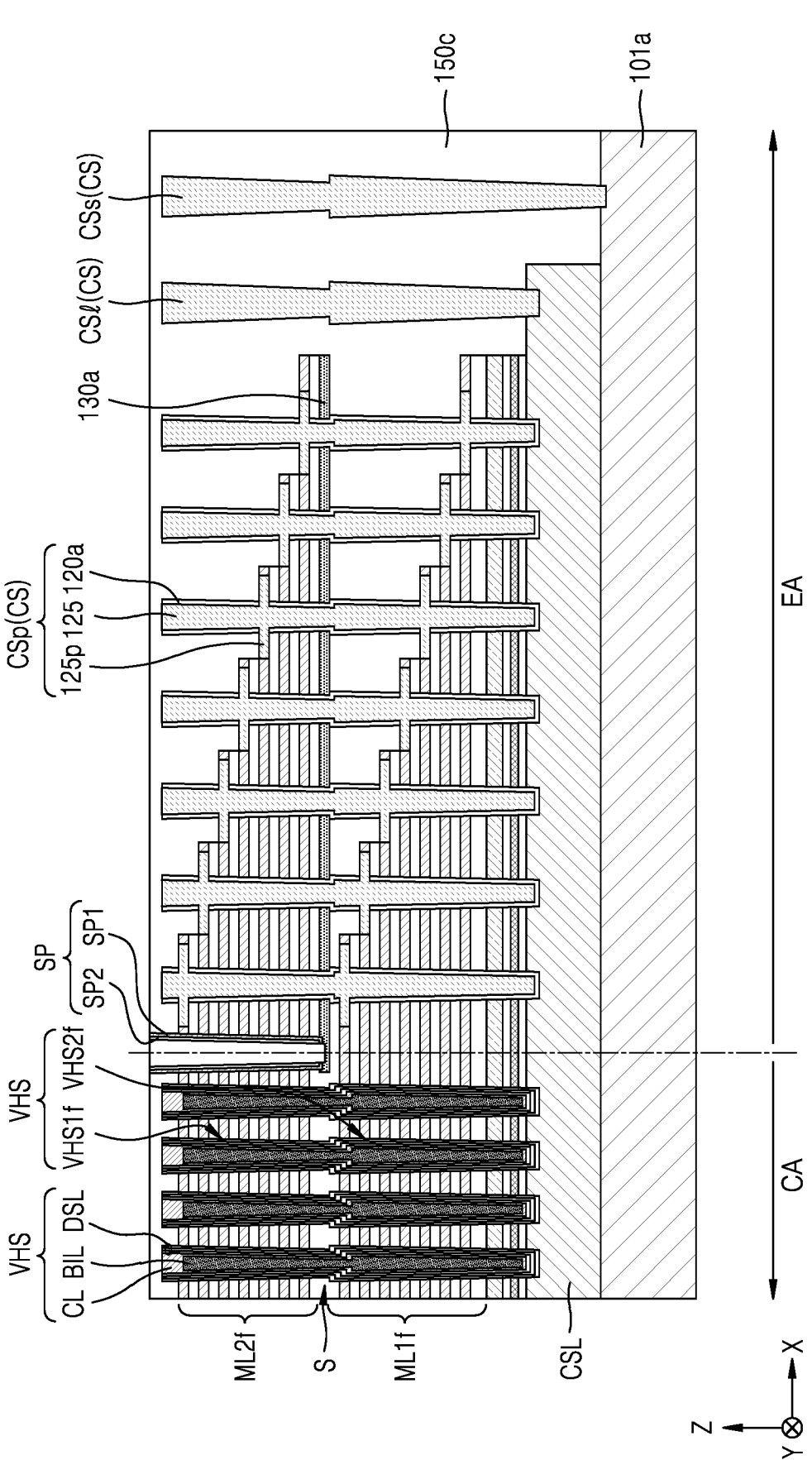
Figure 5I:
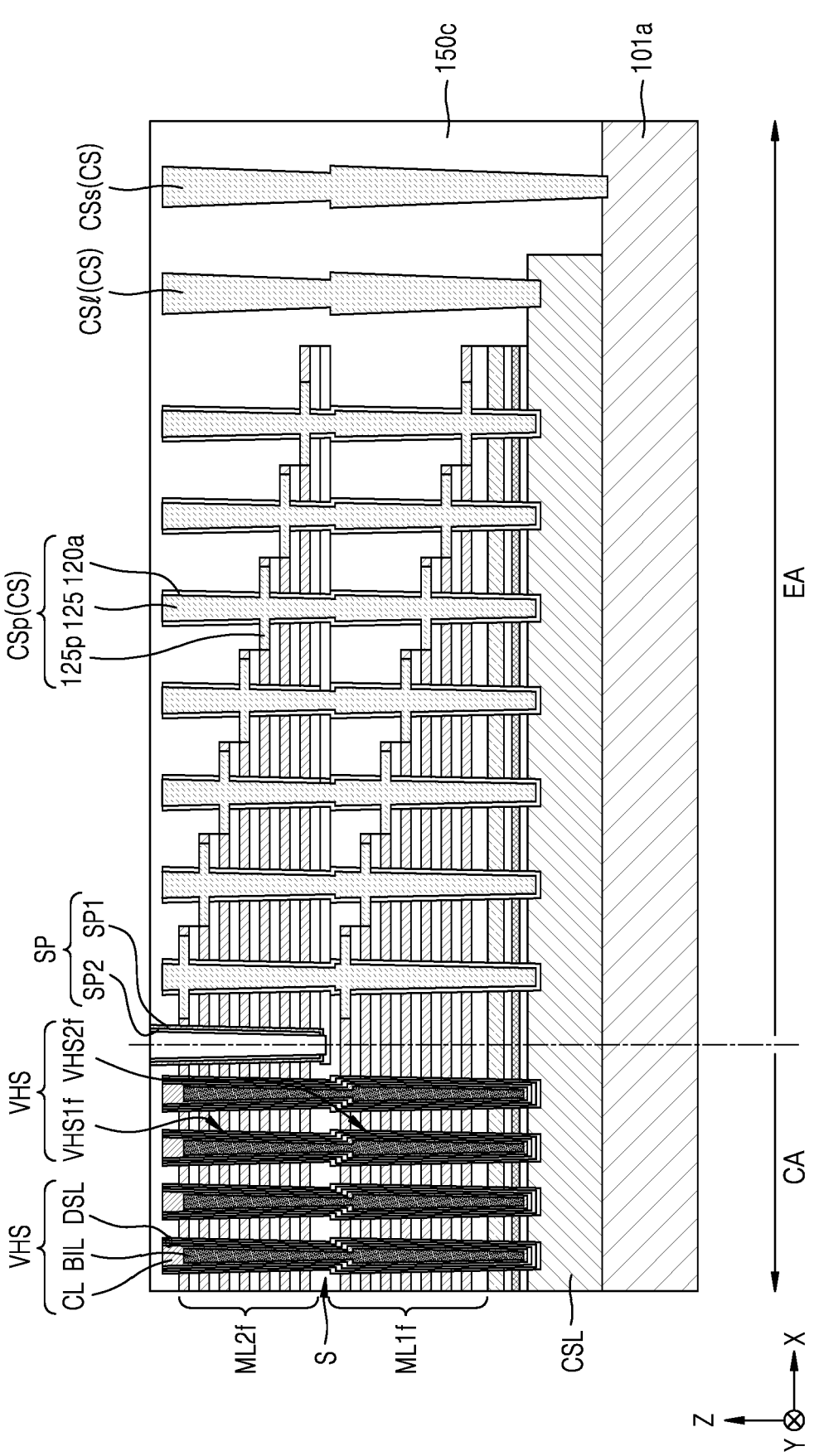
Figure 5J:
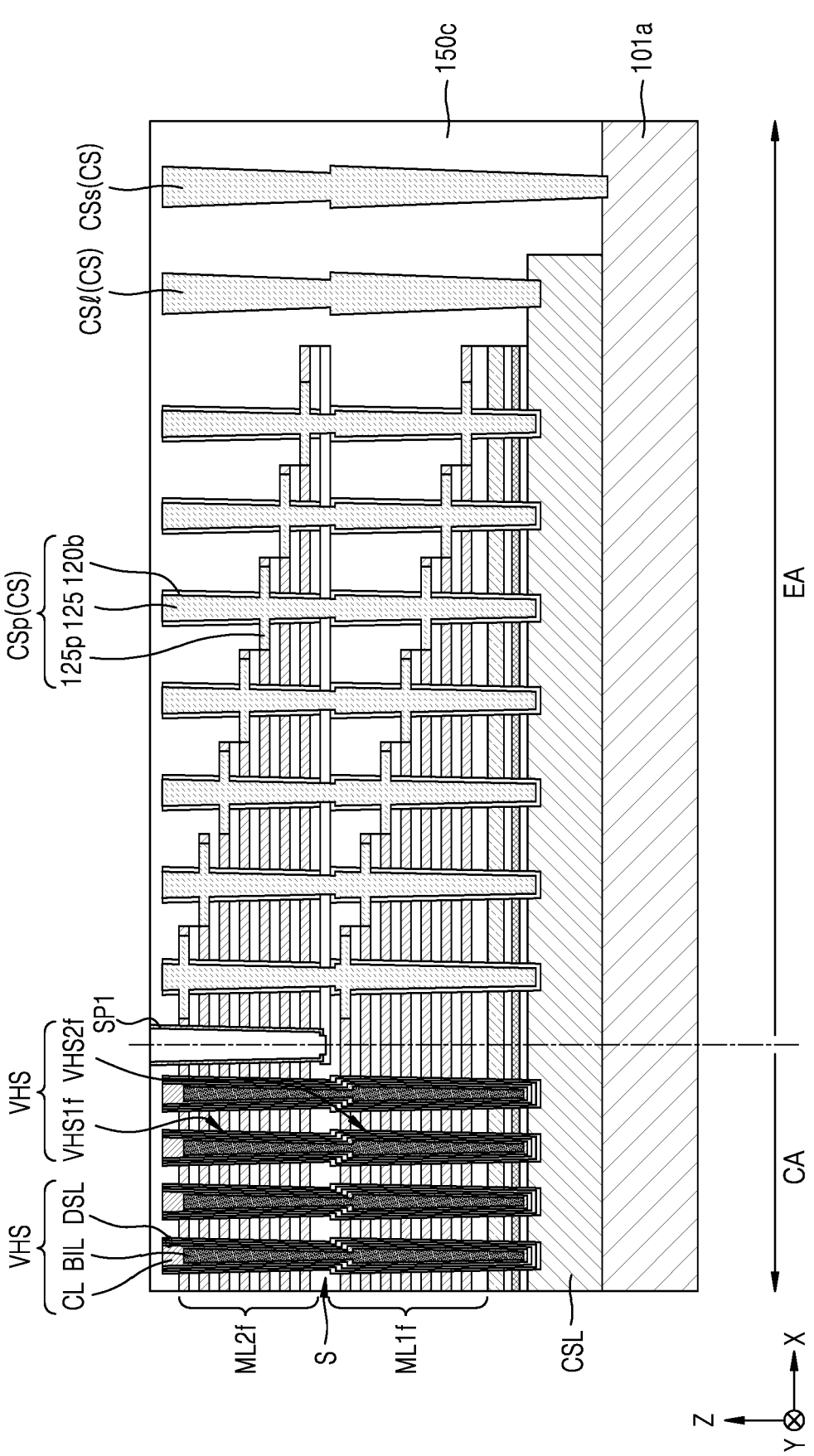
Figure 5K:
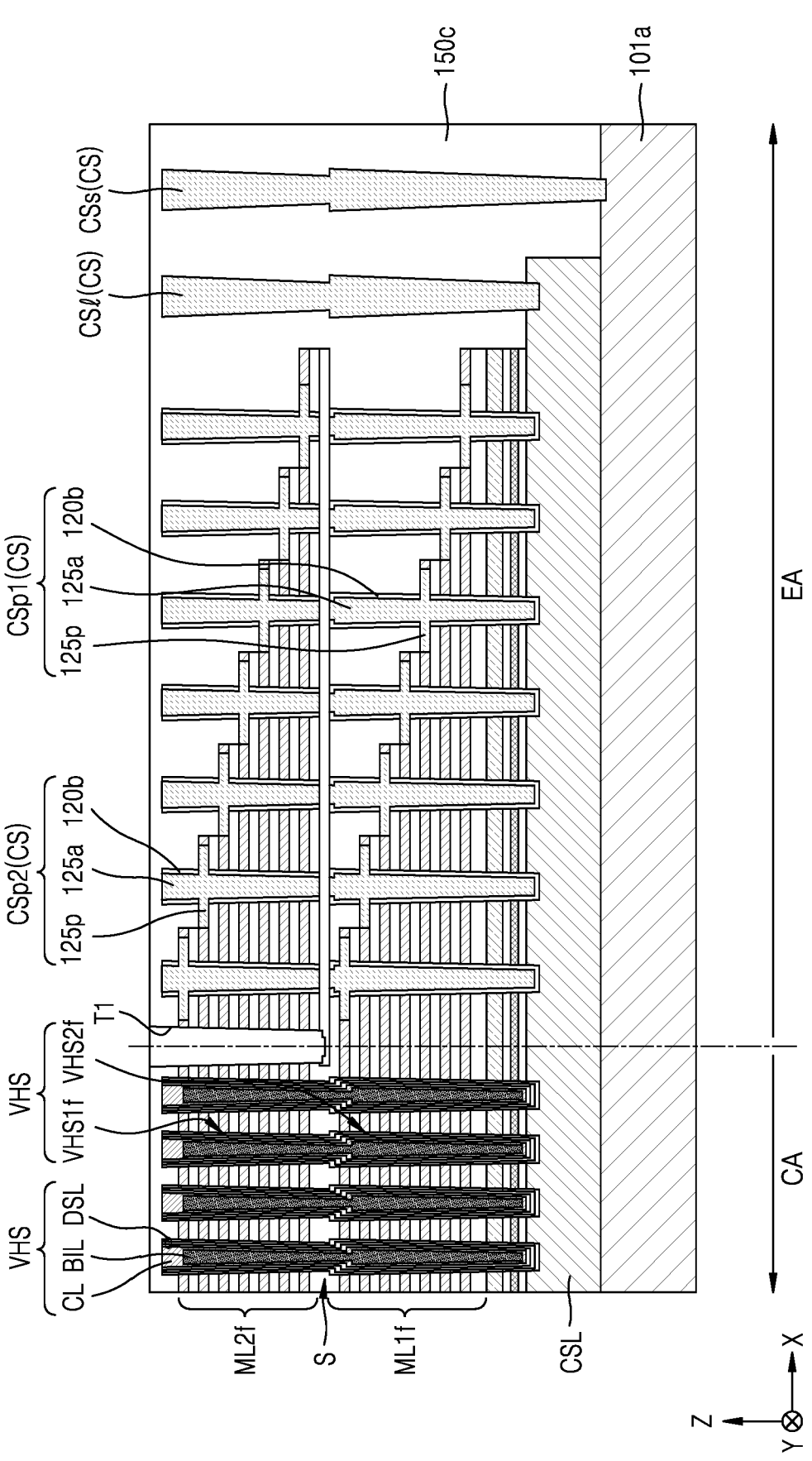
Figure 5L:
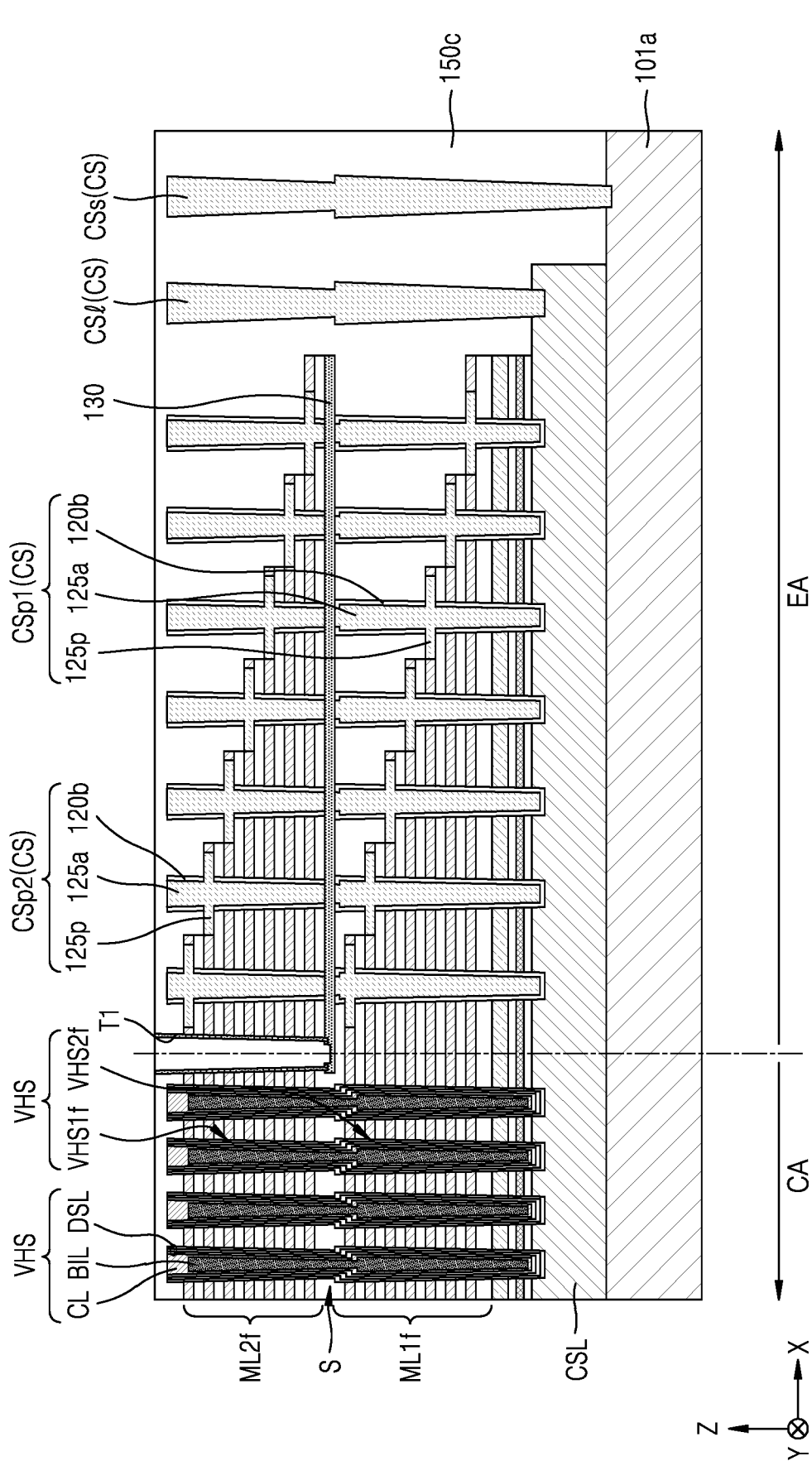
Figure 5M:
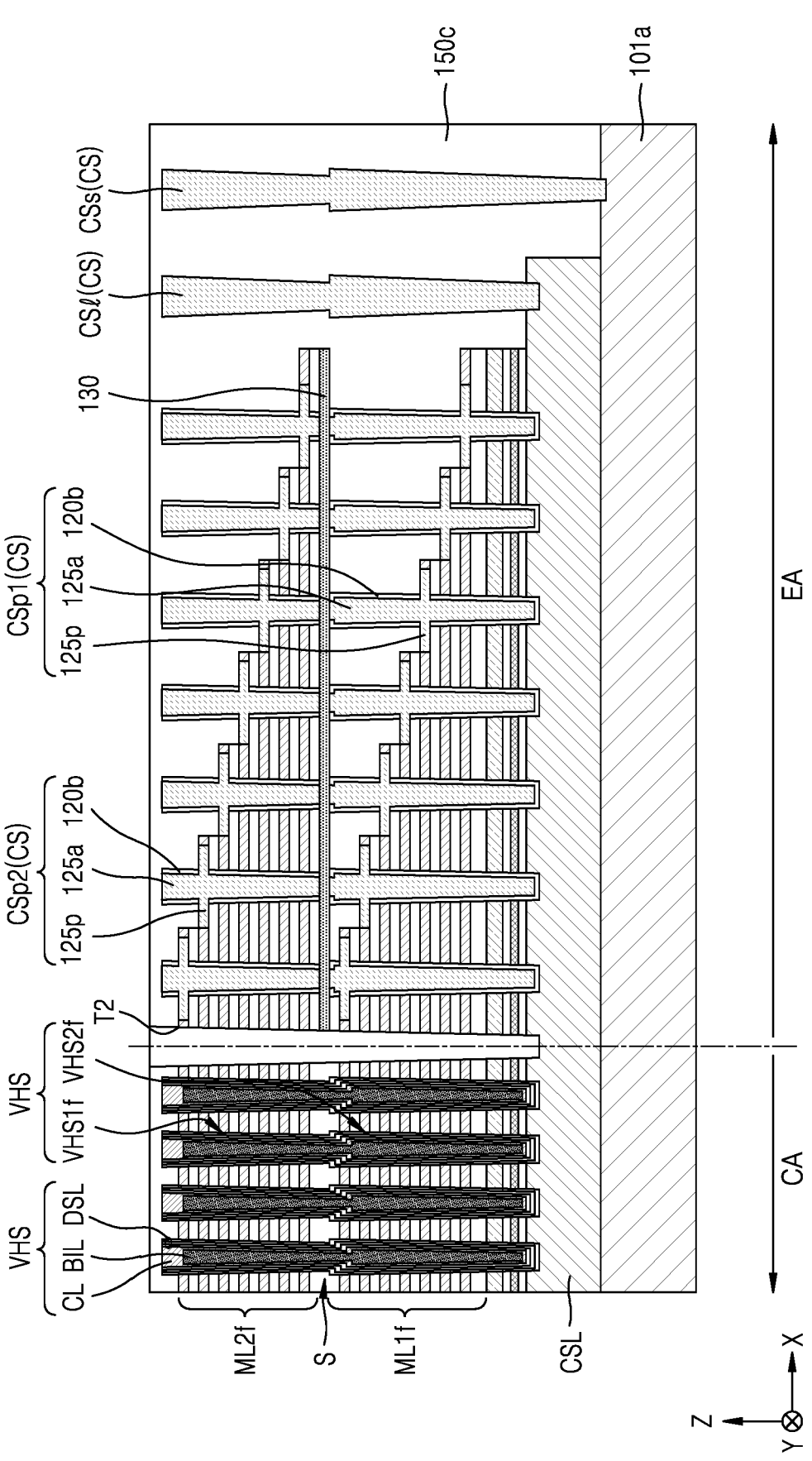
Figure 5N:
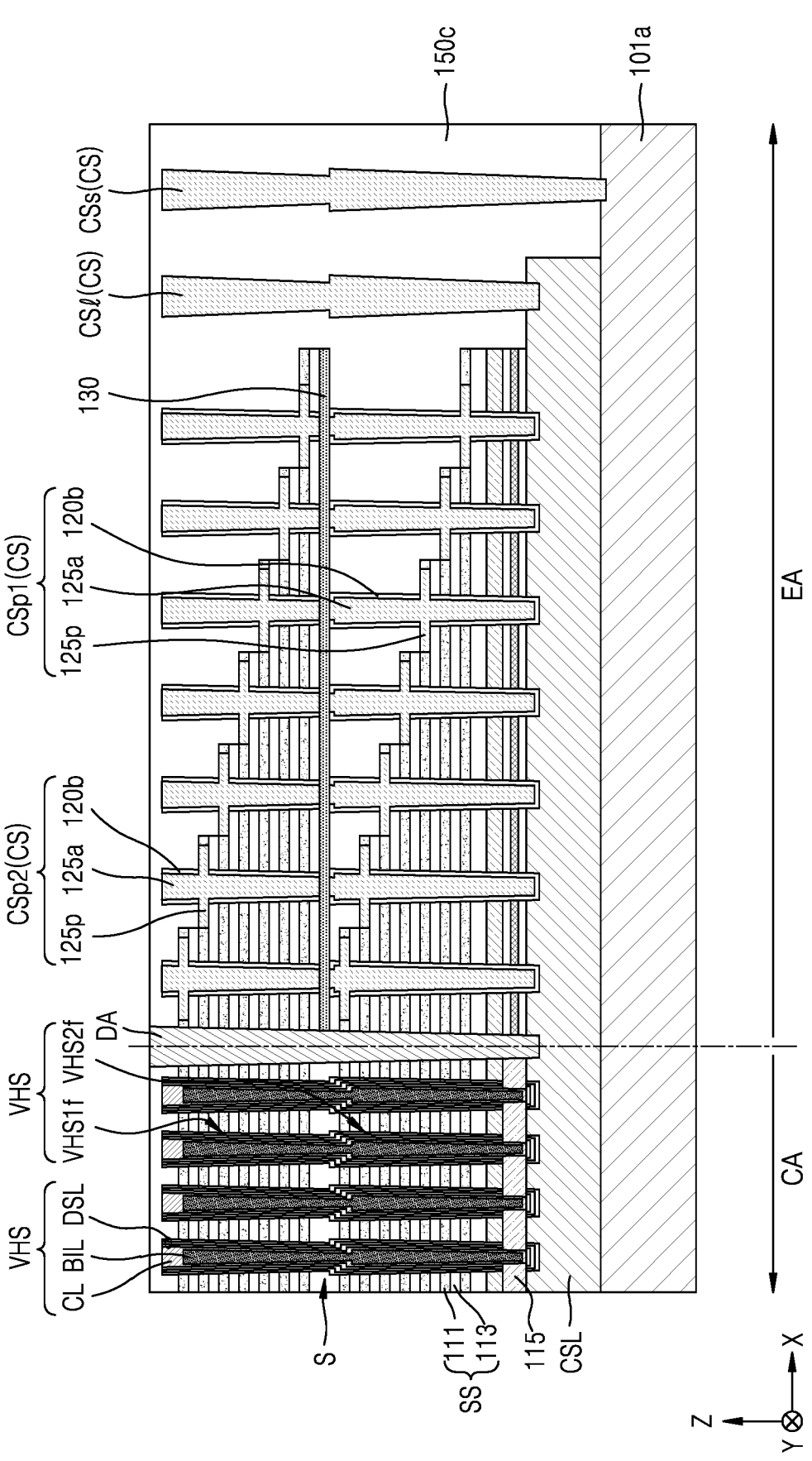
Figure 50:
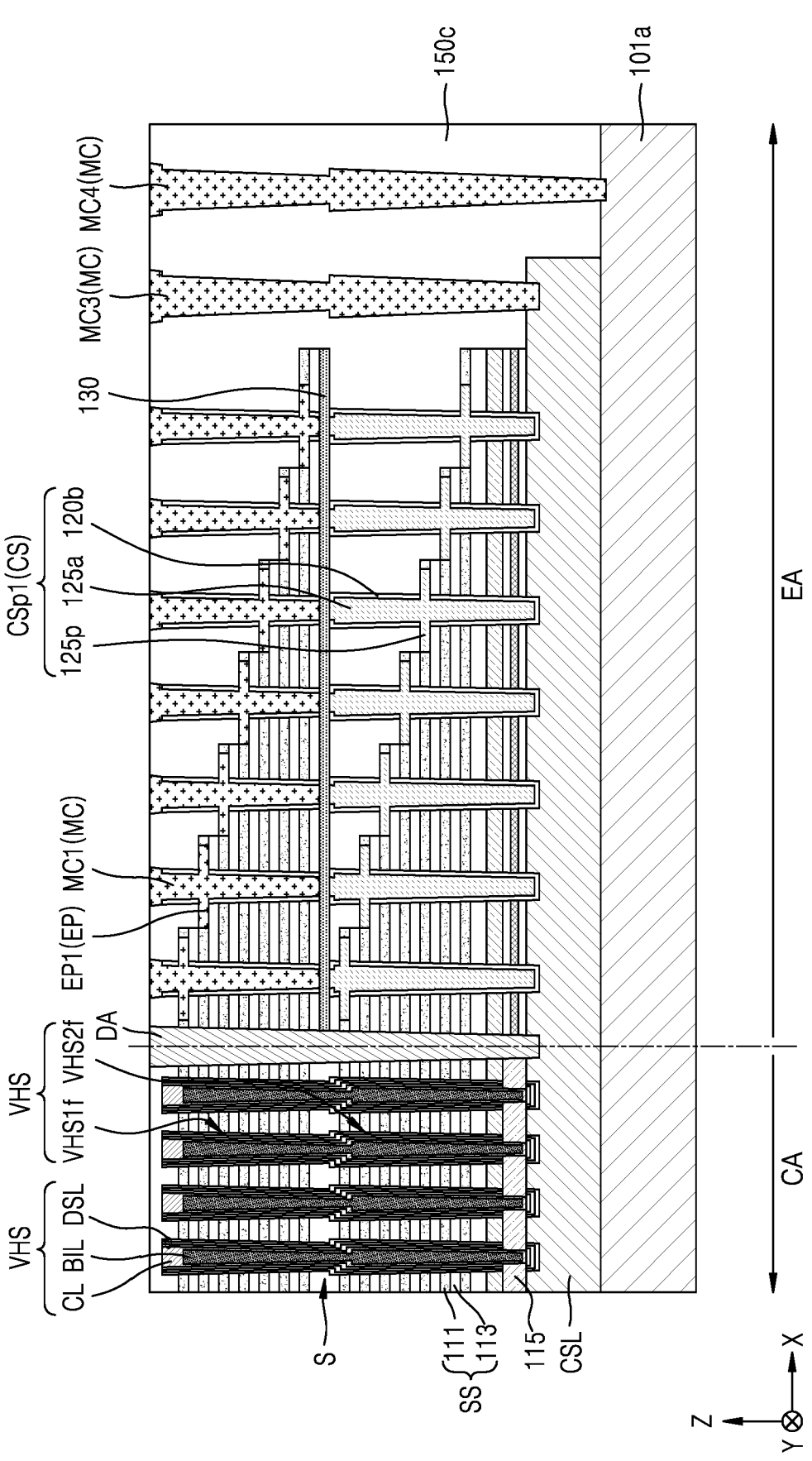
Figure 5P:
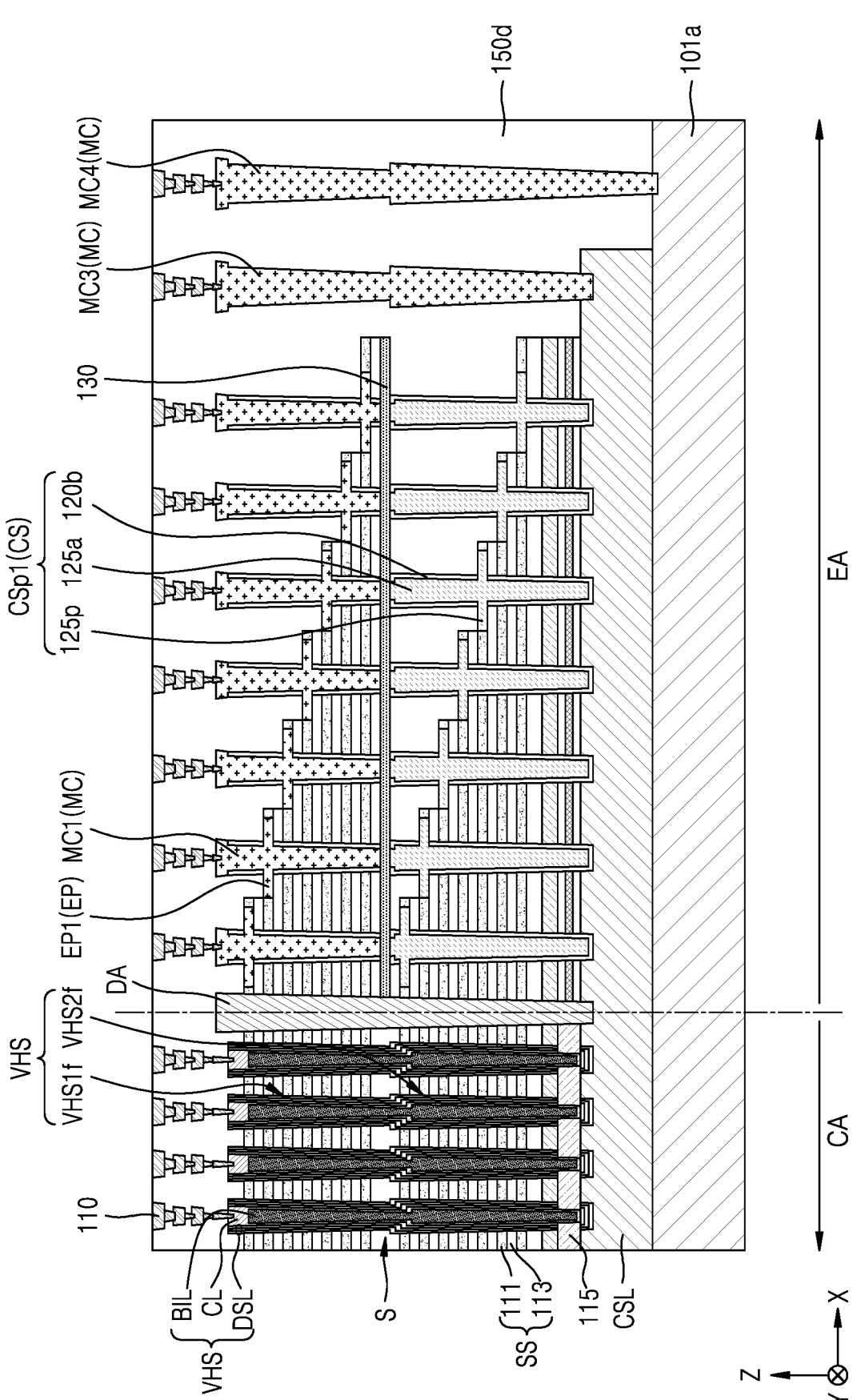
Figure 5Q:
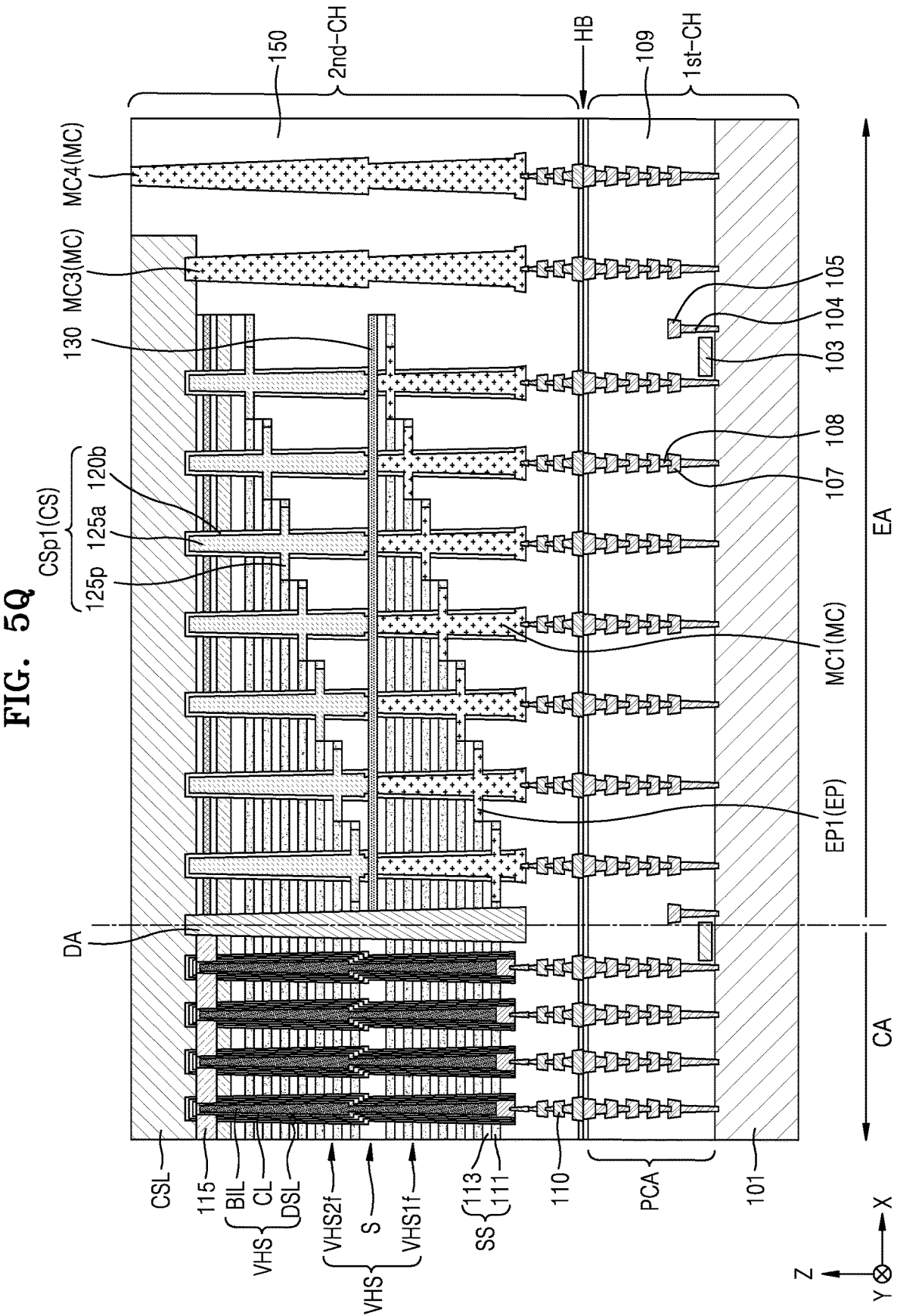
Figure 5R:
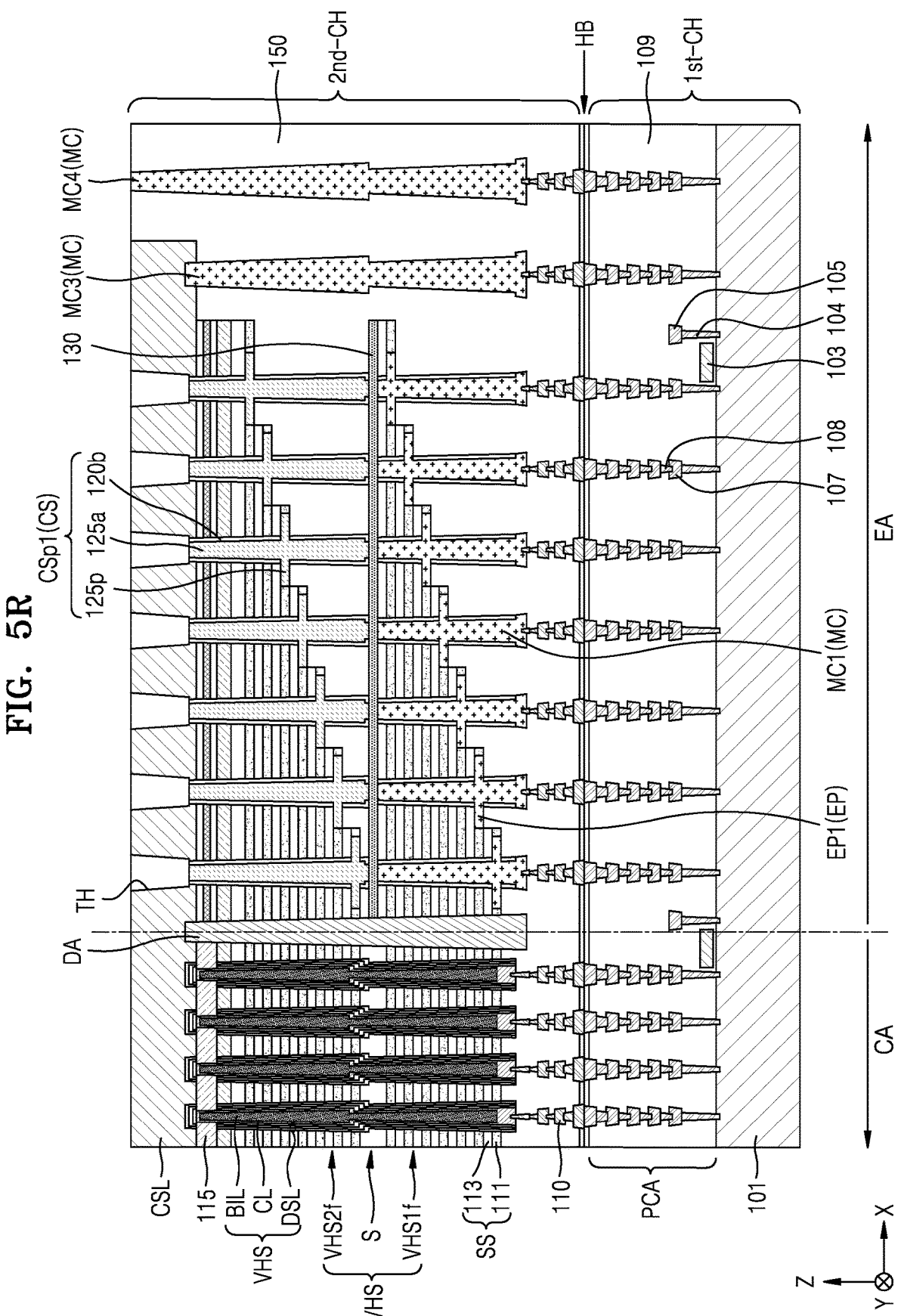
Figure 5S:
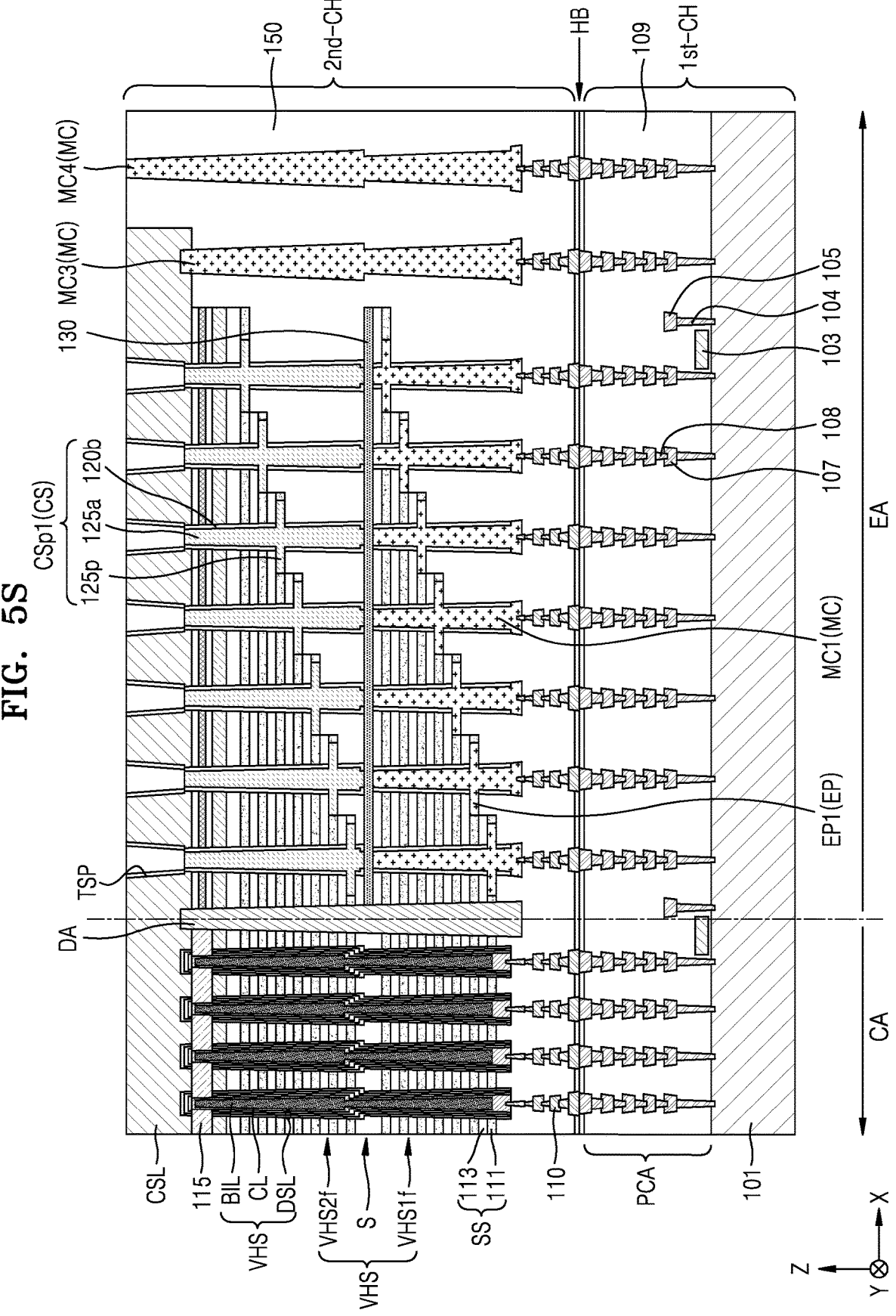
Figure 5T:
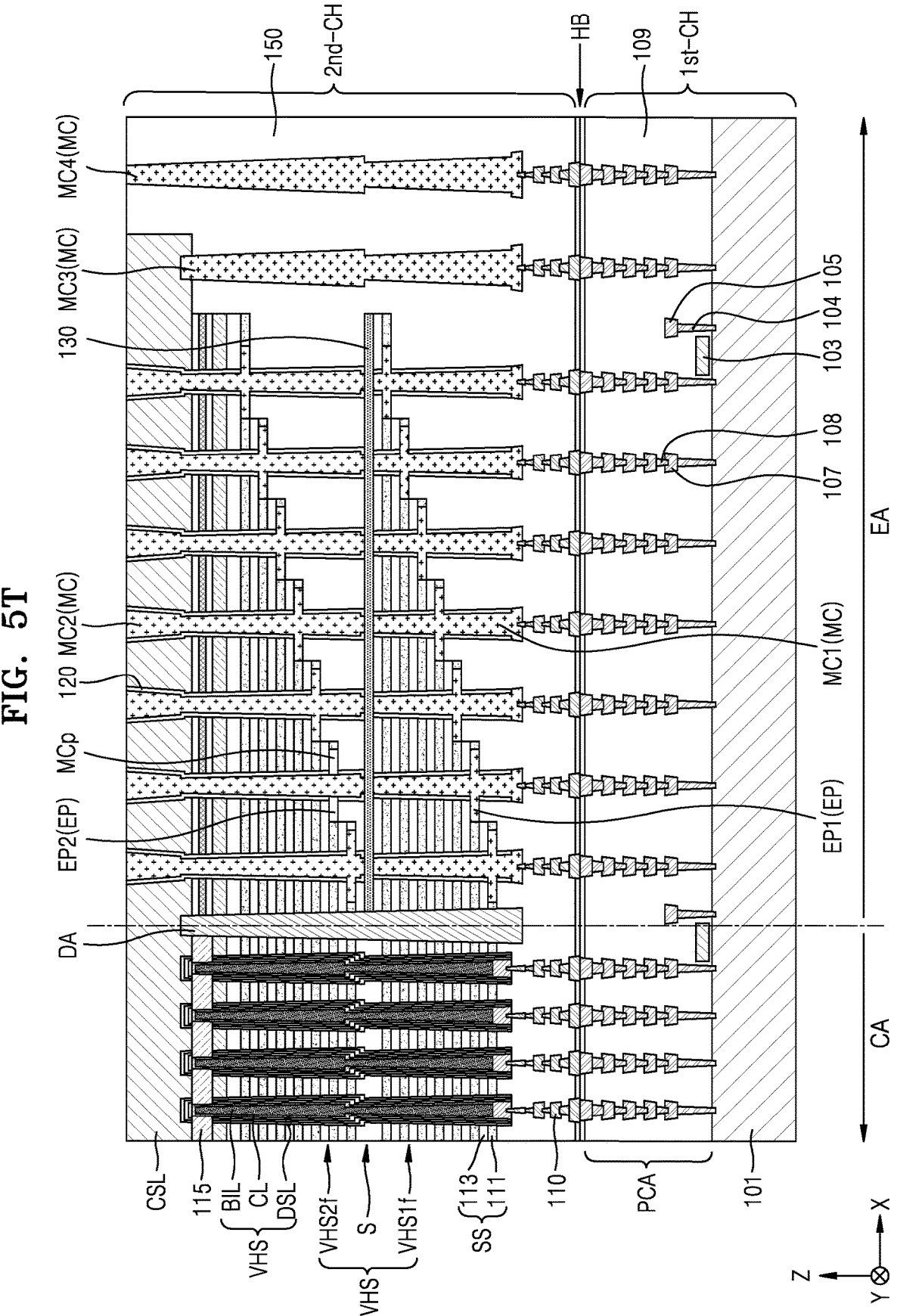
Figure 5U:
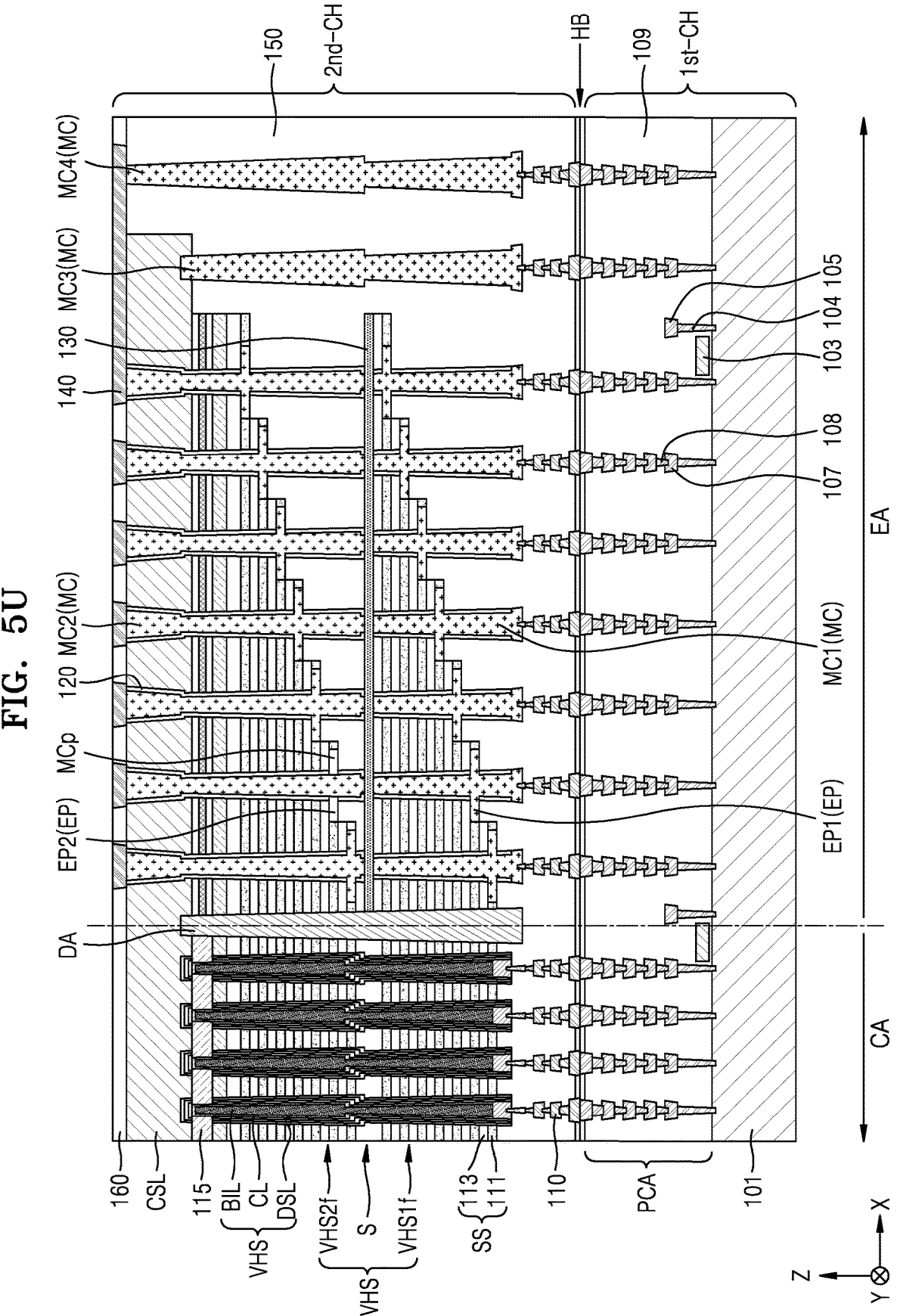

FIGS. 5A to 5U are cross-sectional views illustrating a method of manufacturing the vertical nonvolatile memory device in FIG. 2A according to some embodiments of inventive concepts. Herein, the method of manufacturing the vertical nonvolatile memory device is described with reference to FIGS. 5A to 5U together with FIGS. 2A and 2B, and descriptions as are given with reference to FIGS. 2A and 2B may be briefly given or omitted for the sake of conciseness and/or to reduce repetition.

Referring to FIG. 5A, a preliminary mold structure may be formed on the second substrate 101a at first in a method of manufacturing the vertical nonvolatile memory device according some embodiments. As shown in FIG. 5A, impurities may be doped on an upper portion of the second substrate 101a at first, to thereby form the common source line CSL. Thereafter, the preliminary mold structure may be formed on the common source line CSL. The preliminary mold structure may include a sacrificial layer SL and an interlayer insulating layer ILD that are alternately stacked vertically. In the preliminary mold structure, the sacrificial layer SL may be formed of a material having an etch selectivity with respect to the interlayer insulating layer ILD. For example, a nitride film may be formed as the sacrificial layer SL, and an oxide film may be formed as the interlayer insulating layer ILD. Of course, the materials of the sacrificial layer SL and the interlayer insulating layer ILD are not limited to the materials described above. The sacrificial layer SL may have substantially the same thickness, and the interlayer insulating layer ILD may have a different thickness in some areas. For reference, the sacrificial layer SLa in a lowermost portion may be used later to form the horizontal conductive layer 115. In addition, the supporting conductive layer SCL may be arranged on the sacrificial layer SLa.

Subsequently, a trimming operation may be performed on the preliminary mold structure to thereby form the step structure in the extension area EA. Herein, the trimming operation may include a mask pattern operation of forming a mask pattern on the preliminary mold structure in the cell array area CA and the extension area EA, an etch operation of etching a portion of the preliminary mold structure, and a reduction operation of reducing a horizontal area of the mask pattern. In the trimming operation, the etch and reduction operations may be alternately repeated. After performing the trimming operation, a first mold structure ML1f including the step structure in the extension area EA may be formed on the common source line CSL.

After forming the first mold structure ML1f, a first hole pattern HP1 may be formed in the cell array area CA and the extension area EA. A plurality of penetration holes may be formed through the corresponding first mold structure ML1f and a planar insulating layer 150a, until the common source line CSL and the second substrate 101a are exposed through the penetration holes, and then insulation materials may be filled into the penetration holes, to thereby form the first hole pattern HP1. The first hole pattern HP1 may be formed of the insulation material having an etch selectivity with respect to the first mold structure ML1f. For example, the first hole pattern HP1 may be formed of polysilicon or a spin-on hard-mask (SOH).

The first hole pattern HP1 may include a first cell hole pattern HP1c, a first pad hole pattern HP1p, a first line hole pattern HP11, and a first substrate hole pattern HP1s. The first cell hole pattern HP1c may extend through the first mold structure ML1f of the cell array area CA, until a lower portion of the first cell hole pattern HP1c is inserted into the common source line CSL. The first pad hole pattern HP1p may extend through the first mold structure ML1f of the extension area EA, until a lower portion of the first pad hole pattern HP1p is inserted into the common source line CSL. The first line hole pattern HP11 may extend through the planar insulating layer 150a, until a lower portion of the first line hole pattern HP11 is inserted into the common source line CSL. The first substrate hole pattern HP1s may extend through the planar insulating layer 150a, until a lower portion of the first substrate hole pattern HP1s is inserted into the second substrate 101a.

Referring to FIG. 5B, after forming the first hole pattern HP1, a contact separation sacrificial layer 130a may be formed on the first mold structure ML1f, the first pad hole pattern HP1p, and the planar insulating layer 150a in the extension area EA. As can be seen from FIG. 5B, the contact separation sacrificial layer 130a may cover most of the extension area EA. However, as shown in FIG. 5B, the contact separation sacrificial layer 130a may not cover the first line hole pattern HP11 and the first substrate hole pattern HP1s. The contact separation sacrificial layer 130a may be formed of a material having an etch selectivity with respect to the first mold structure ML1f. For example, the contact separation sacrificial layer 130a may be formed of polysilicon.

Referring to FIG. 5C, a second mold structure ML2f may be formed on the first mold structure ML1f, the planar insulating layer 150a, the first hole pattern HP1, and the contact separation sacrificial layer 130a. The second mold structure ML2f may have substantially the same structure as the first mold structure ML1f. Accordingly, the second mold structure ML2f may include the sacrificial layer SL and the interlayer insulating layer ILD that are alternately stacked vertically, and may include the step structure in the extension area EA. The second mold structure ML2f may be formed by the same method as described above to form the first mold structure ML1f.

After forming the second mold structure ML2f, a second hole pattern HP2 may be formed through the second mold structure ML2f in the cell array area CA and the extension area EA. A plurality of penetration holes may be formed through the corresponding second mold structure ML2f and a planar insulating layer 150b, until the corresponding first hole pattern HP1 is exposed through the penetration holes, and then insulation materials may be filled into the penetration holes, to thereby form the second hole pattern HP2. The second hole pattern HP2 may be formed of substantially the same material as the first hole pattern HP1. For example, the second hole pattern HP2 may be formed of polysilicon or a spin-on hard-mask (SOH).

The second hole pattern HP2 may also include a second cell hole pattern HP2c, a second pad hole pattern HP2p, a second line hole pattern HP21, and a second substrate hole pattern HP2s. The first cell hole pattern HP1c and the corresponding second cell hole pattern HP2c may be formed into a cell hole pattern HPc. The first pad hole pattern HP1p and the corresponding second pad hole pattern HP2p may be formed into a pad hole pattern HPp. The first line hole pattern HP11 and the corresponding second line hole pattern HP21 may be formed into a line hole pattern HP1. The first substrate hole pattern HP1s and the corresponding second substrate hole pattern HP2s may be formed into a substrate hole pattern HPs. The first hole pattern HP1 and the second hole pattern HP2 may be formed into the hole pattern HP, and the stepped portion S may be provided at a positions where the first hole pattern HP1 and the second hole pattern HP2 are connected.

Referring to FIG. 5D, after forming the second hole pattern HP2, the cell hole pattern HPc in the cell array area CA may be removed, and the vertical channel structure VHS may be formed. The vertical channel structure VHS may be formed after covering the pad hole pattern HPp, the line hole pattern HP1, and the substrate hole pattern HPs with a mask and exposing the cell hole pattern HPc. Then, the vertical channel structure VHS may be formed by removing the cell hole pattern HPc filling the portions, from which the cell hole pattern HPc is removed, with corresponding material layers. For example, the vertical channel structure VHS may include a buried insulating layer BIL, a channel layer CL, and a data storage layer DSL. In addition, the vertical channel structure VHS may be configured in a two-store structure having the first-floor vertical channel structure VHS1*f* and the second-floor vertical channel structure VHS2*f*. The stepped portion S may be formed at a boundary area where the first-floor vertical channel structure VHS1*f* and the second-floor vertical channel structure VHS2*f* are connected with each other due to the structure of the cell hole pattern HPc.

Referring to FIG. 5E, after forming the vertical channel structure VHS, the pad hole pattern HPp, the line hole pattern HP1, and the substrate hole pattern HPs may be removed in the extension area EA, and a contact formation sacrificial layer CS (used to form contacts) may be formed in the extension area EA. The contact formation sacrificial layer CS may include a pad contact formation sacrificial layer CSp corresponding to the pad hole pattern HPp, a line contact formation sacrificial layer CSl corresponding to the line hole pattern HP1, and a substrate contact formation sacrificial layer CSs corresponding to the substrate hole pattern HPs. In addition, the pad contact formation sacrificial layer CSp used to form a pad contact may include a buried sacrificial layer 125, a contact spacer 120*a*, and a protruding sacrificial layer 125*p*. The line contact formation sacrificial layer CSl used to form the line contact and the substrate contact formation sacrificial layer CSs used to form the substrate contact may be formed of the same material as the buried sacrificial layer 125. For example, the buried sacrificial layer 125 and the protruding sacrificial layer 125*p* may be formed of polysilicon, and the contact spacer 120*a* may be formed of an oxide. According to some embodiments, the line contact formation sacrificial layer CS1 and the substrate contact formation sacrificial layer CSs may have a structure including the buried sacrificial layer and the contact spacer.

Referring to FIG. 5F, after forming the contact formation sacrificial layer CS, a first trench T1 may be formed through the second mold structure ML2*f*, until the contact separation sacrificial layer 130*a* is exposed through the first trench T1. The first trench T1 may correspond to an upper portion of the separation area DA that is formed in a subsequent operation. Accordingly, a plurality of first trenches T1 extending in the first direction (X direction) and spaced apart from each other in the second direction (Y direction) may be formed.

Referring to FIG. 5G, a spacer layer SPL may be formed in the first trench T1. The spacer layer SPL may include a first spacer layer SPL1 and a second spacer layer SPL2. Although not shown, the spacer layer SPL may also be formed on the top surface of a planar insulating layer 150*c*. For example, the first spacer layer SPL1 may be formed of polysilicon, and the second spacer layer SPL2 may be formed of an oxide. However, the materials of the first spacer layer SPL1 and the second spacer layer SPL2 are not limited to the descriptions given above. For example, the materials of the first spacer layer SPL1 and the second spacer layer SPL2 may vary depending on the material of the contact formation sacrificial layer CS.

Referring to FIG. 5H, an etch-back operation may be performed on the spacer layer SPL in such a manner that the spacer layer SPL is partially removed from a bottom surface of the first trench T1 and from a top surface of the planar insulating layer 150*c*, to thereby form a spacer SP. The spacer SP may include a first spacer SP1 and a second spacer SP2. In addition, the contact separation sacrificial layer 130*a* may be exposed through the bottom surface of the first trench T1 by the etch-back operation.

Referring to FIG. 5I, after forming the spacer SP, the contact separation sacrificial layer 130*a* may be removed through the bottom surface of the first trench T1. The contact separation sacrificial layer 130*a* may be removed using a wet etching operation. Thus, a side surface of the contact formation sacrificial layer CS, for example, the contact spacer 120*a* may be exposed by the removal of the contact separation sacrificial layer 130*a*.

Referring to FIG. 5J, the second spacer SP2 and the exposed contact spacer 120*a* may be continuously removed. The second spacer SP2 and the exposed contact spacer 120*a* may be removed by wet etching operation. As described above, as formed of the same material, i.e., an oxide, the second spacer SP2 and the contact spacer 120*a* may be removed together. However, as a portion of the contact spacer 120*a* is exposed through the area from which the contact separation sacrificial layer 130*a* is removed, the contact spacer 120*a* may be partially removed. The buried sacrificial layer 125 may be exposed as the contact spacer 120*a* is partially removed. In addition, only the first spacer SP1 may remain in the first trench T1 as the second spacer SP2 and a portion of the contact spacer 120*a* are removed.

Referring to FIG. 5K, the first spacer SP1 and the exposed buried sacrificial layer 125 may be removed. The first spacer SP1 and the exposed buried sacrificial layer 125 may be removed using a wet etching operation. Since being formed of the same material, i.e., polysilicon, as described above, the first spacer SP1 and the buried sacrificial layer 125 may be removed simultaneously together.

As a portion of the buried sacrificial layer 125 is partially exposed through an area from which the contact spacer 120*a* may be partially removed, the buried sacrificial layer 125 may be partially removed. As illustrated in FIG. 5K, the pad contact formation sacrificial layer CSp may be separated into a first pad contact formation sacrificial layer CSp1 at a lower portion and a second pad contact formation sacrificial layer CSp2 at an upper portion by partially removing the buried sacrificial layer 125.

Referring to FIG. 5L, an insulating layer, for example, an oxide layer may be filled into a portion from which the contact separation sacrificial layer 130*a* is removed and a portion from which the buried sacrificial layer 125 is removed. Accordingly, the contact separation layer 130 may be formed. As illustrated in FIG. 2B, the contact separation layer 130 may cover most of the extension area EA. However, the contact separation layer 130 may not cover the outer portion of the extension area EA in the first direction (X direction), for example, the line contact formation sacrificial layer CS1 and the substrate contact formation sacrificial layer CSs. An insulating layer may also be formed on a side wall and the bottom surface of the first trench T1 in forming the contact separation layer 130.

Referring to FIG. 5M, after forming the contact separation layer 130, the first trench T1 may extend vertically downwards, to thereby form a second trench T2 through which the common source line CSL is exposed. The second trench T2 may correspond to the whole separation area DA.

Referring to FIG. 5N, the gate electrode layer(s) 111 may be formed using the second trench T2. More particularly, the sacrificial layer(s) SL may be exposed through the second trench T2 and may be removed, and a metal material, for example, tungsten (W), may be filled in the removed portion, to thereby form the gate electrode layer(s) 111. The operation of forming the gate electrode layer(s) 111 by replacing the sacrificial layer SL is referred to as a gate line replacement operation. A stacked structure SS may be formed by the formation of a plurality of gate electrode layers 111. The interlayer insulating layer(s) 113 of the stacked structure SS may be substantially the same as the previous interlayer insulating layer ILD. After forming the stack structure SS, the second trench T2 may be filled with one or more insulating materials, for example, an oxide, to thereby form the separation area DA.

When forming the gate electrode layer 111, the horizontal conductive layer 115 that penetrates through the data storage layer DSL and is connected with the channel layer CL at a side surface of the vertical channel structure VHS may be formed. As can be seen from FIG. 5N, the sacrificial layer SLa may be maintained in the extension area EA, while the sacrificial layer SLa is replaced by the horizontal conductive layer 115 in the cell array area CA.

Referring to FIG. 5O, the second pad contact formation sacrificial layer CSp2, the line contact formation sacrificial layer CSl, and the substrate contact formation sacrificial layer CSs may be opened and the buried sacrificial layer 125 may be removed. A metal, such as tungsten (W), may then be filled into the gap, to thereby form the first metal contact MC1, the third metal contact MC3, and the fourth metal contact MC4. In regard to the second pad contact formation sacrificial layer CSp2, the protruding sacrificial layer 125p may also be removed, and a metal material may be filled therein, to thereby form the first electrode pad EP1 together with the first metal contact MC1.

When the line contact formation sacrificial layer CS1 and the substrate contact formation sacrificial layer CSs may have such a structure that the contact spacer is provided together with the buried sacrificial layer, an additional operation of removing the contact spacer around a bottom surface may be performed when removing the buried sacrificial layer 125.

Referring to FIG. 5P, after forming the first metal contact MC1, the third metal contact MC3, and the fourth metal contact MC4, the second wiring layer 110 may be formed on an upper portion of a planar insulating layer 150d. The second wiring layer 110 may be connected to the vertical channel structure VHS in the cell array area CA. In addition, the second wiring layer 110 may be connected to the first metal contact MC1, the third metal contact MC3, and the fourth metal contact MC4 in the extension area EA.

Referring to FIG. 5Q, after forming the second wiring layer 110, the second chip $2^{nd}$-CH may be flipped over in such a manner that the second substrate 101a is directed towards, and then, the flipped second chip $2^{nd}$-CH may be bonded to the first chip $1^{st}$-CH using a hybrid bonding HB. Although the second chip $2^{nd}$-CH is described as being bonded to the first chip $1^{st}$-CH above, a second wafer may include a plurality of second chips $2^{nd}$-CH, a first wafer may include a plurality of first chips 1st-CH, and the second wafer (including the second chips $2^{nd}$-CH) may be bonded to the first wafer (including the first chips $1^{st}$-CH) using hybrid bonding HB. Thereafter, the second substrate 101a of the second chip $2^{nd}$-CH may be removed. Accordingly, the common source line CSL of the second chip $2^{nd}$-CH may be exposed, and the planar insulating layer 150 and the fourth metal contact MC4 may also be exposed.

Referring to FIG. 5R, penetration holes TH may be formed to expose the first pad contact formation sacrificial layer CSp1 where the penetration holes TH penetrate through the common source line CSL.

Referring to FIG. 5S, a penetrating hole spacer TSP may be formed on a side surface of the penetrating hole TH. The penetrating hole spacer TSP may be formed of an insulating material, such as an oxide. The penetrating hole spacer TSP may be formed to reduce/prevent connection of the second metal contact MC2 with the common source line CSL in a subsequent operation.

Referring to FIG. 5T, the first pad contact formation sacrificial layer CSp1, which is exposed through a bottom surface of the penetration hole TH, may be removed and replaced with a metal material, such as tungsten (W), to thereby form the second metal contact MC2. The second electrode pad EP2 may also be formed when forming the second metal contact MC2.

Referring to FIG. 5U, after forming the second metal contact MC2, the wiring insulating layer 160 may be formed on the common source line CSL, the fourth metal contact MC4, and the planar insulating layer 150. Thereafter, the third wiring layer 140 may be formed through/in the wiring insulating layer 160. The third wiring layer 140 may make the second metal contact MC2 connect with the fourth metal contact MC4.

Figure 6A:
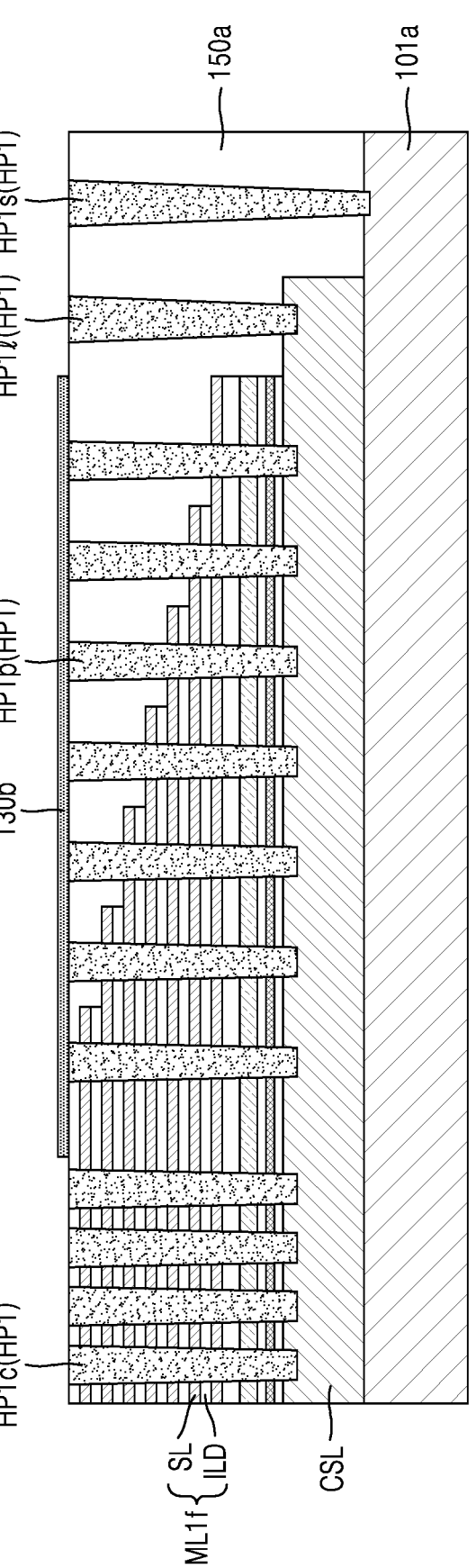
FIGS. 6A and 6B are respective cross-sectional and plan views illustrating operations of manufacturing a vertical nonvolatile memory device according to some embodiments of inventive concepts.
Figure 6B:
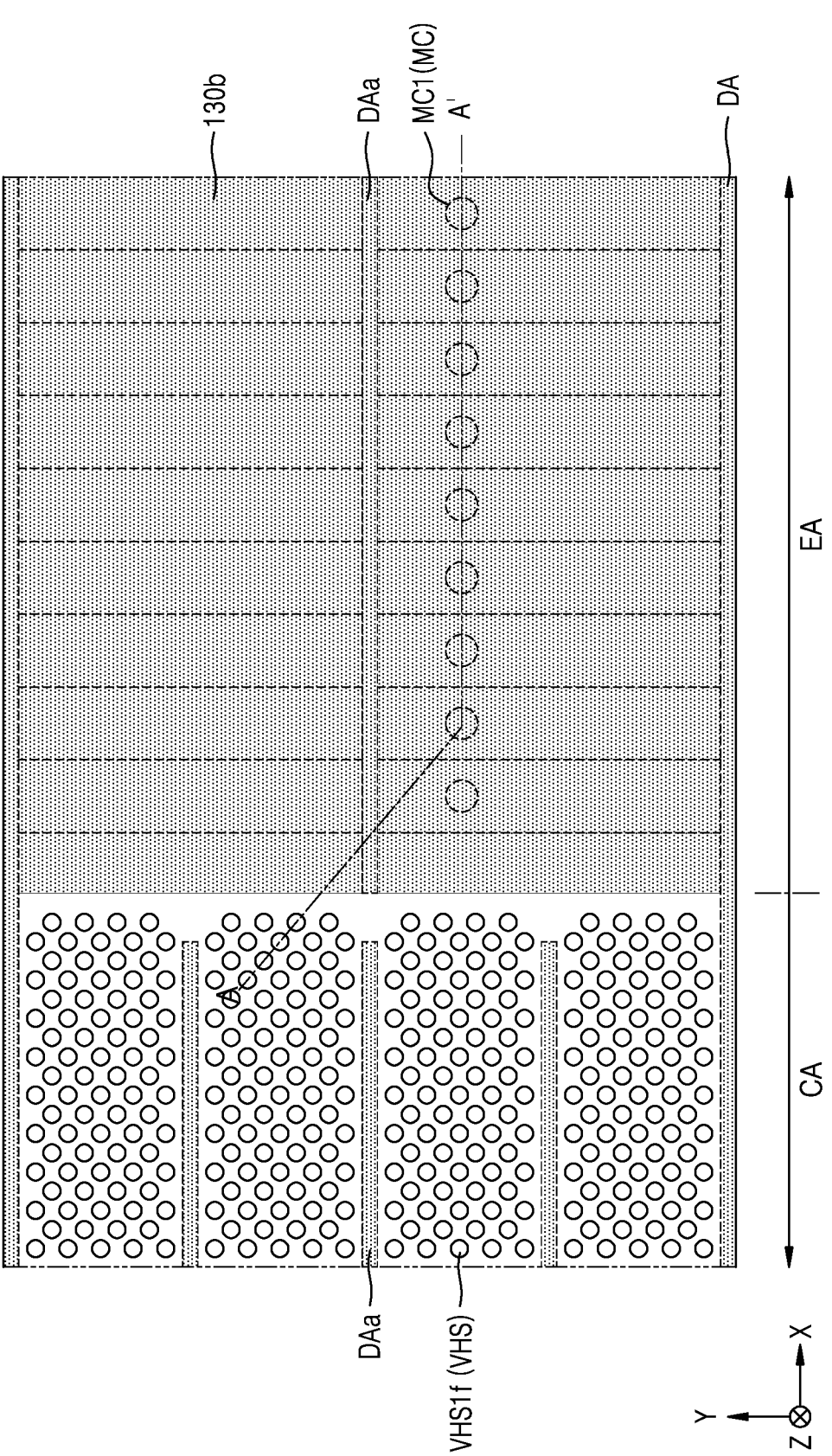

FIGS. 6A and 6B are respective cross-sectional and plan views illustrating operations of manufacturing a vertical nonvolatile memory device according to some embodiments of inventive concepts. FIG. 6A is a cross-sectional view taken along section line A-A' of FIG. 6B, and FIG. 6B is a plan view of FIG. 6A. Herein, operations of manufacturing the vertical nonvolatile memory device are described with reference to FIGS. 6A and 6B together with FIGS. 5A to 5U, and the same descriptions as are given with reference to FIGS. 5A to 5U may be briefly given or omitted for the sake of conciseness and/or to reduce repetition.

Referring to FIGS. 6A and 6B, the first mold structure ML1f may be formed on the second substrate 101a and the first hole pattern HP1 may be formed through the first mold structure ML1f and though the planar insulating layer 150a in the cell array area CA and in the extension area EA, as described above with reference to FIG. 5A, in a method of manufacturing the vertical nonvolatile memory of some embodiments. Thereafter, a contact separation sacrificial layer 130b may be formed on the first mold structure ML1f in the cell array area CA and the extension area EA. More particularly, the contact separation sacrificial layer 130b may cover the first mold structure ML1f, the first pad hole pattern HP1p, and the planar insulating layer 150a in the extension area EA. In addition, the contact separation sacrificial layer 130b may cover portions of the first mold structure ML1f corresponding to the separation area DA and the additional separation area DAa in the cell array area CA. The contact separation sacrificial layer 130b may comprise substantially the same material as the contact separation sacrificial layer 130a, as described in detail with reference to FIG. 5B. Thereafter, the vertical nonvolatile memory device 100 of FIG. 2A may be manufactured using operations described above with reference to FIGS. 5C to 5U.

According to a method of manufacturing the vertical nonvolatile memory device of some embodiments, the contact separation sacrificial layer 130b may also be formed on the first mold structure ML1f in the cell array area CA, and thus, the contact separation sacrificial layer 130b may function as an etch stopper in the cell array area CA when forming the first trench T1. Accordingly, the first trench T1 may be uniformly formed in the cell array area CA and the extension area EA.

FIGS. 7A to 7F are cross-sectional views illustrating operations of manufacturing the vertical nonvolatile memory device in FIG. 3 according to some embodiments. Herein, operations of manufacturing the vertical nonvolatile memory device are described with reference to FIGS. 7A to 7F together with FIG. 3, and the same descriptions as are given with reference to FIG. 3 and FIGS. 5A to 5U may be briefly given or omitted for the sake of conciseness and/or to reduce repetition.

Figure 7A:
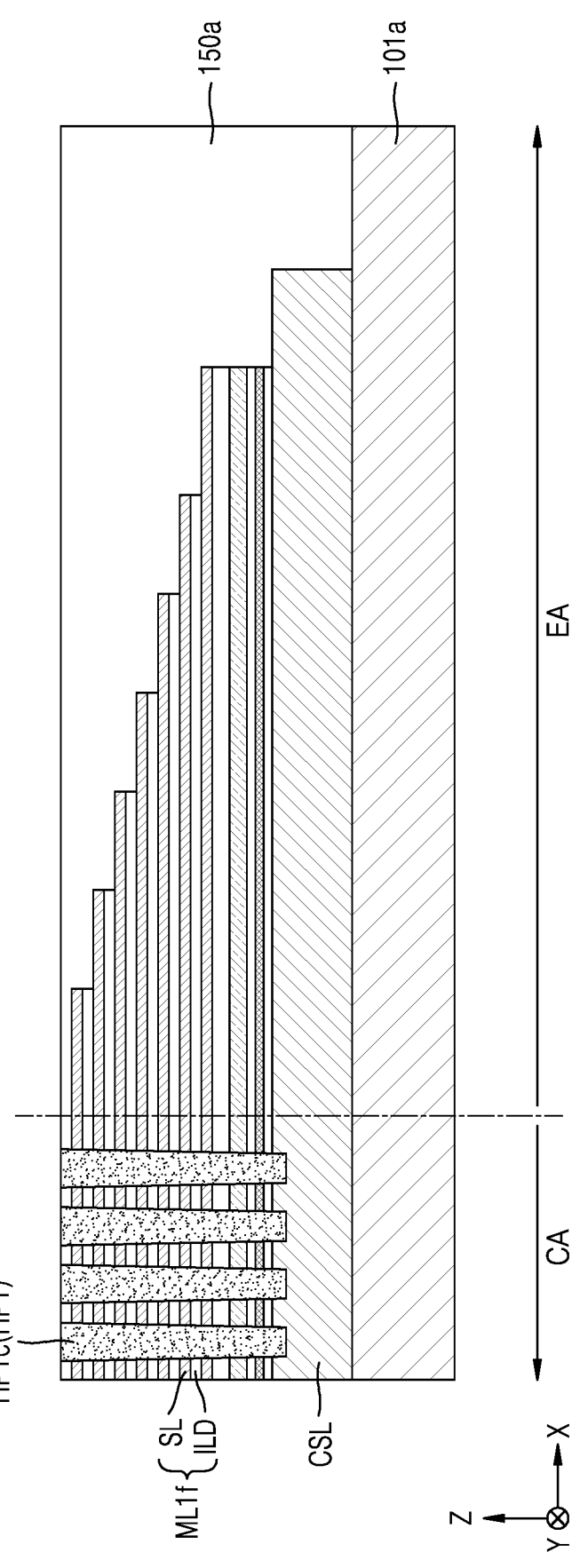
FIGS. 7A to 7F are cross-sectional views illustrating operations of manufacturing the vertical nonvolatile memory device in FIG. 3 according to some embodiments of inventive concepts.

Referring to FIG. 7A, a first mold structure ML1*f* may be formed on the second substrate 101*a* at first, as described in detail with reference to FIG. 5A, in operations of manufacturing the vertical nonvolatile memory device according to some embodiments. Thereafter, a first hole pattern HP1, that is, a first cell hole pattern HP1*c*, may be formed through the first mold structure ML1*f* in the cell array area CA. For example, the first hole pattern HP1 may be formed only in the cell array area CA by covering the extension area EA with a mask and opening only the cell array area CA.

Figure 7B:
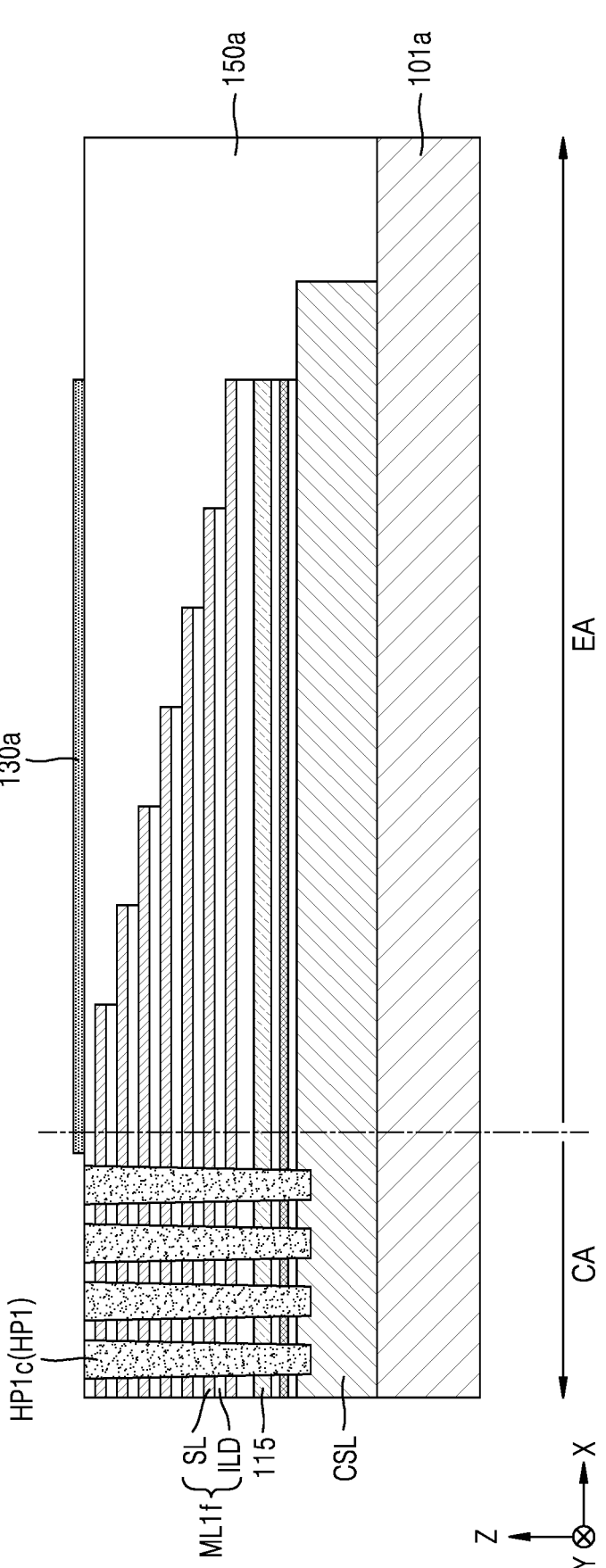

Referring to FIG. 7B, after forming the first hole pattern HP1, a contact separation sacrificial layer 130*a* may be formed in the extension area EA to cover the first mold structure ML1*f* and the planar insulating layer 150*a*. As can be seen from FIG. 7B, the contact separation sacrificial layer 130*a* may cover most of the extension area EA. However, as shown in FIG. 7B, the contact separation sacrificial layer 130*a* may not cover portions of the first mold structure ML1*f* where the first line hole pattern and the first substrate hole pattern are to be formed. The contact separation sacrificial layer 130*a* may comprise substantially the same material as the contact separation sacrificial layer 130*a*, as described in detail with reference to FIG. 5B.

Figure 7C:
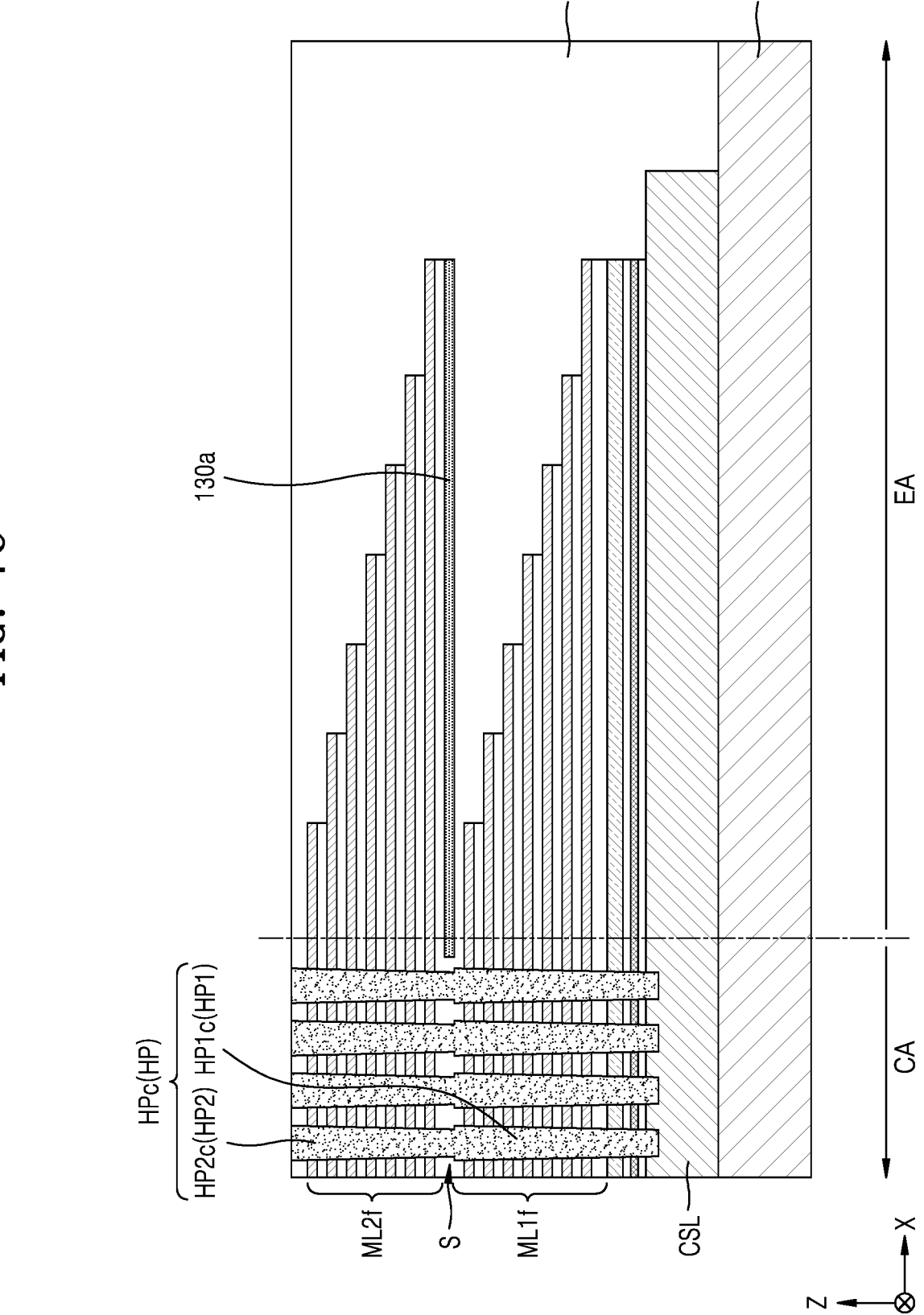

Referring to FIG. 7C, a second mold structure ML2*f* may be formed on the first mold structure ML1*f*, the planar insulating layer 150*a*, the first hole pattern HP1, and the contact separation sacrificial layer 130*a*. The second mold structure ML2*f* may have substantially the same structure as the first mold structure ML1*f*. The second mold structure ML2*f* may be formed using the same operations used to form the first mold structure ML1*f*.

After forming the second mold structure ML2*f*, a second hole pattern HP2 (that is, a second cell hole pattern HP2*c*) may be formed in the cell array area CA. The second hole pattern HP2 may be formed by forming a penetration hole that penetrates through the second mold structure ML2*f* and exposes the first hole pattern HP1, and then filling an insulation material into the penetration hole. When the second hole pattern HP2 is formed in the cell array area CA, the extension area EA may be covered with the mask. The second hole pattern HP2 may be formed of substantially the same material as the first hole pattern HP1. For example, the second hole pattern HP2 may be formed of polysilicon or a spin-on hard-mask (SOH). The first cell hole pattern HP1*c* and the second cell hole pattern HP2*c* may be formed into the cell hole pattern HPc. In addition, the cell hole pattern HPc may be included in the hole pattern HP. The stepped portion S may be formed at the boundary area where the first cell hole pattern HP1*c* and the second cell hole pattern HP2*c* are connected with each other.

Figure 7D:
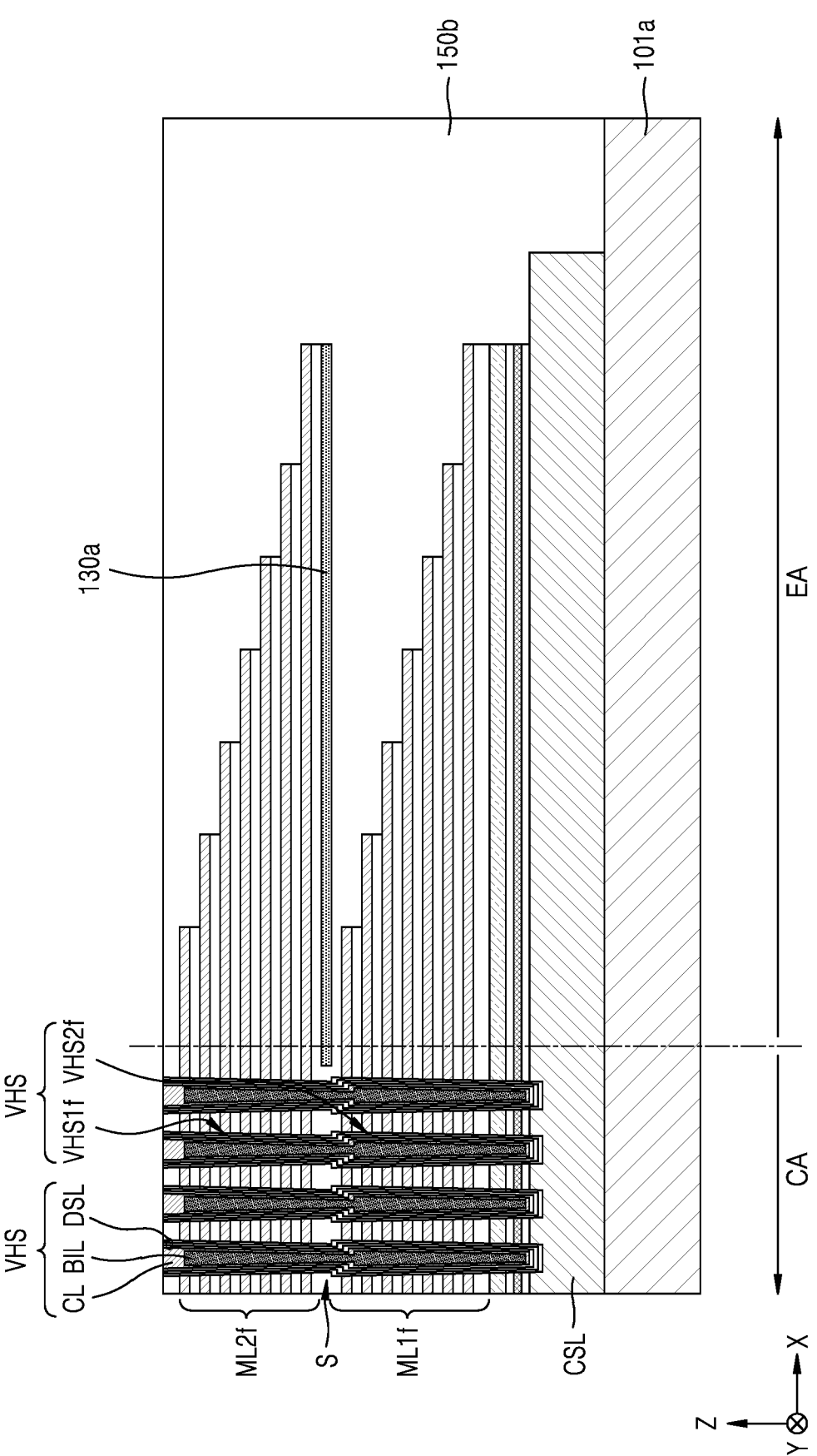

Referring to FIG. 7D, after forming the second hole pattern HP2, the hole pattern HP in the cell array area CA, that is, the cell hole pattern HPc, may be removed and the vertical channel structure VHS may be formed in place of the cell hole pattern HPc. The vertical channel structure VHS may include a buried insulating layer BIL, a channel layer CL, and a data storage layer DSL. In addition, the vertical channel structure VHS may have the two-story structure including a first-floor vertical channel structure VHS1*f* and a second-floor vertical channel structure VHS2*f*. The stepped portion S may be formed at the boundary area where the first-floor vertical channel structure VHS1*f* and the second-floor vertical channel structure VHS2*f* are connected with each other due to the structure of the cell hole pattern HPc.

Figure 7E:
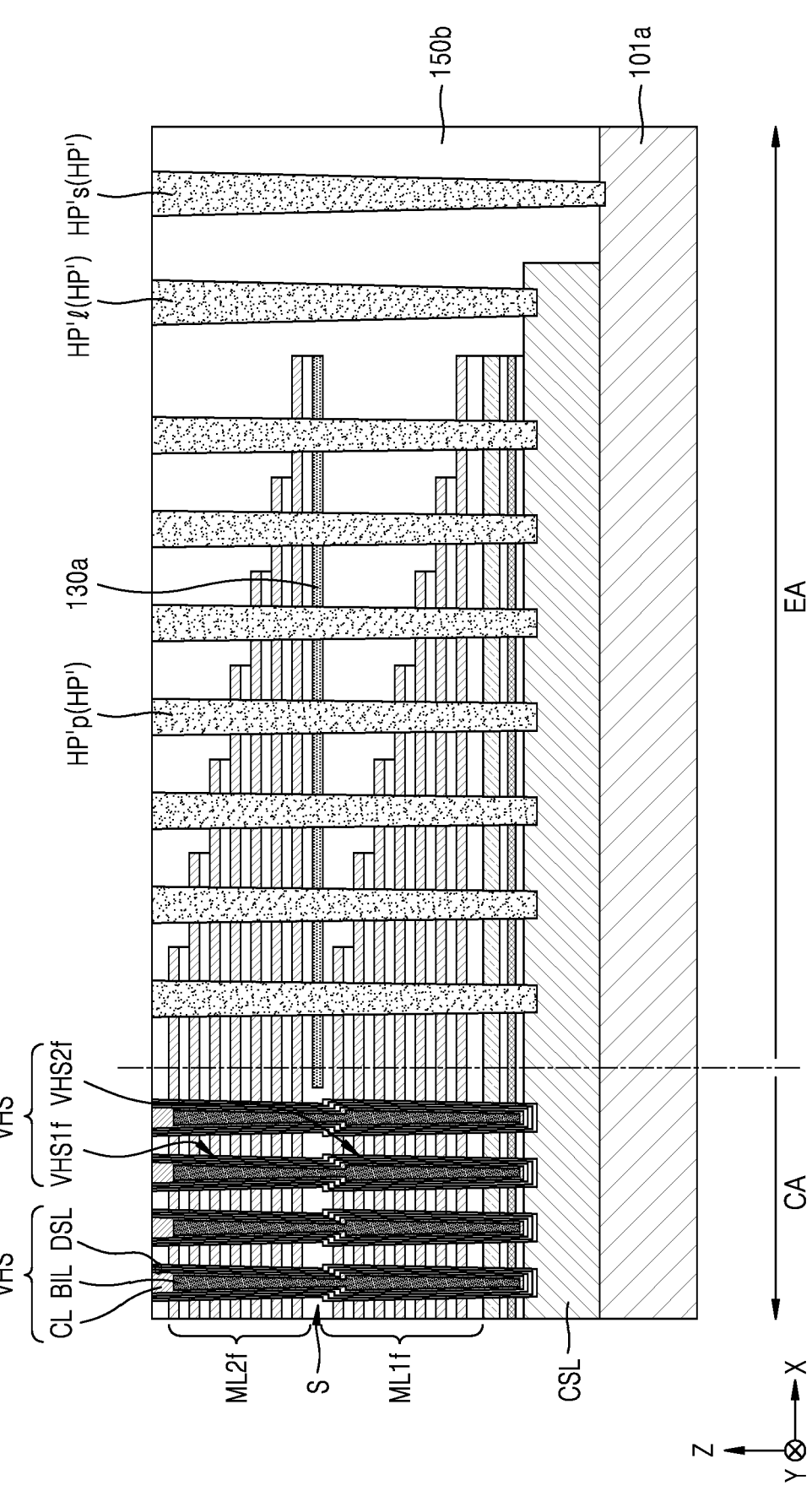

Referring to FIG. 7E, after forming the vertical channel structure VHS, a hole pattern HP' may be formed in the extension area EA. A penetrating hole may be formed through both of the first mold structure ML1*f* and the second mold structure ML2*f* or the planar insulating layer 150*b* until the common source line CSL and/or the second substrate 101*a* is exposed, and then, the penetrating hole may be filled with insulation materials, to thereby form the hole pattern HP'. The hole pattern HP' in the extension area EA may include a pad hole pattern HP'p, a line hole pattern HP'1, and a substrate hole pattern HP's. In addition, the hole pattern HP' may be connected to the common source line CSL and/or the second substrate 101*a* in a single penetrating hole, so that the hole pattern HP' has no stepped portion. The hole pattern HP' may be formed of substantially the same material as the hole pattern HP in FIG. 5C. For example, the hole pattern HP' may be formed of polysilicon or a spin-on hard-mask (SOH).

Figure 7F:
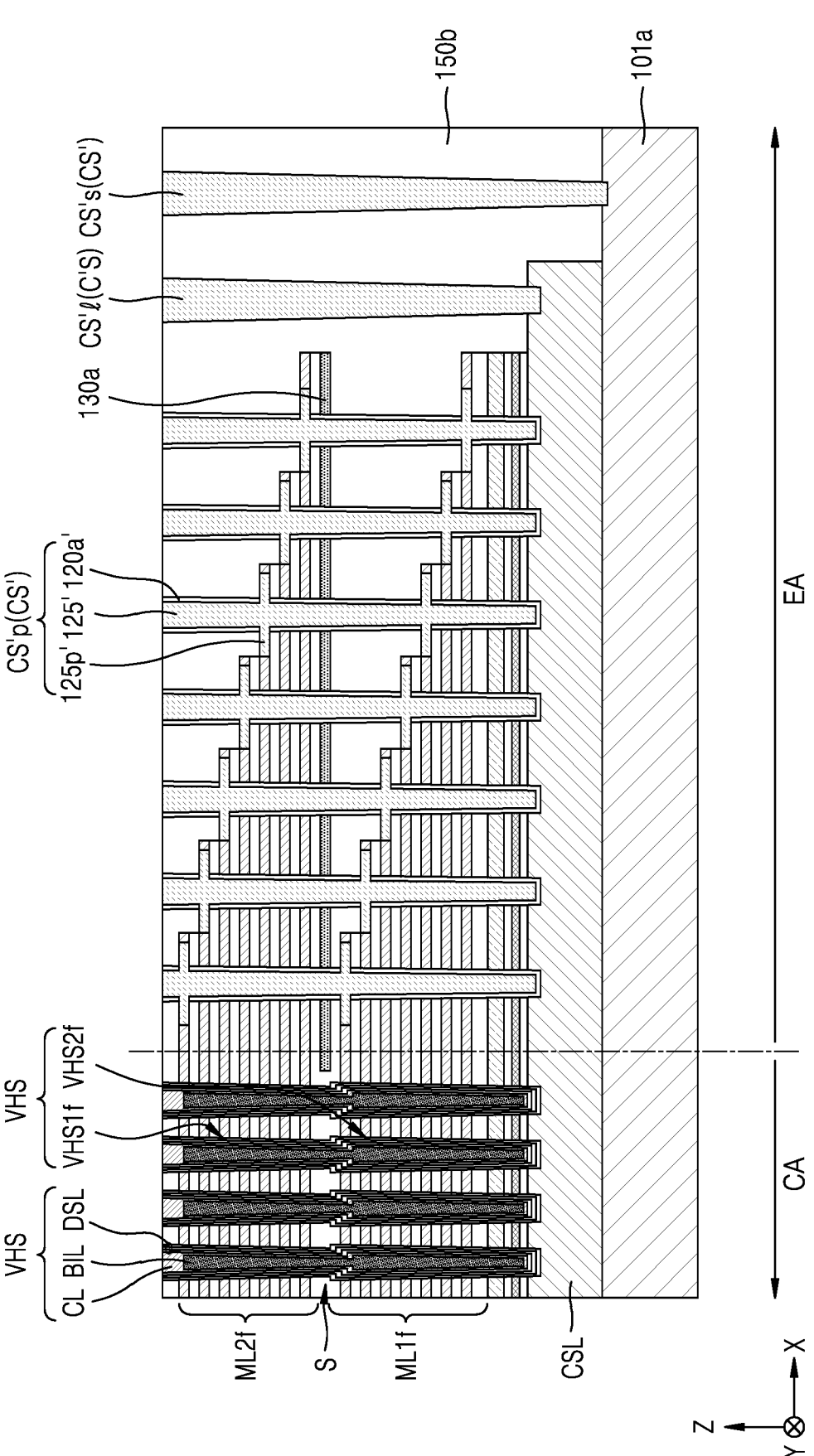

Referring to FIG. 7F, the pad hole pattern HP'p, the line hole pattern HP'1, and the substrate hole pattern HP's in the extension area EA may be removed, and the contact formation sacrificial layer CS' (used to form a contact) may be formed in place of the pad hole pattern HP'p, the line hole pattern HP'1, and the substrate hole pattern HP's. The contact formation sacrificial layer CS' may include a pad contact formation sacrificial layer CS'p corresponding to the pad hole pattern HP'p, a line contact formation sacrificial layer CS'1 corresponding to the line hole pattern HP'1, and a substrate contact formation sacrificial layer CS's corresponding to the substrate hole pattern HP's. In addition, the pad contact formation sacrificial layer CS'p used to form the pad contact may include a buried sacrificial layer 125', a contact spacer 120'*a*, and a protruding sacrificial layer 125'*p*. The line contact formation sacrificial layer CS'1 and the substrate contact formation sacrificial layer CS's may be formed of the same material as the buried sacrificial layer 125'. For example, the buried sacrificial layer 125' and the protruding sacrificial layer 125'*p* may be formed of polysilicon, and the contact spacer 120'*a* may be formed of an oxide. According to some embodiments, the line contact formation sacrificial layer CS'1 and the substrate contact formation sacrificial layer CS's may have a structure including the buried sacrificial layer and the contact spacer. Thereafter, the vertical nonvolatile memory device 100*a* of FIG. 3 may be manufactured by performing the operations as described with reference to FIGS. 5F to 5U.

FIGS. 8A to 8E are cross-sectional views illustrating a method of manufacturing the vertical nonvolatile memory device in FIG. 4 according to some embodiments of inventive concepts. Herein, operations of manufacturing the vertical nonvolatile memory device are described with reference to FIGS. 8A to 8E together with FIG. 4, and the same descriptions as are given with reference to FIG. 4 may be briefly given or omitted for the sake of conciseness and/or to reduce repetition.

Figure 8A:
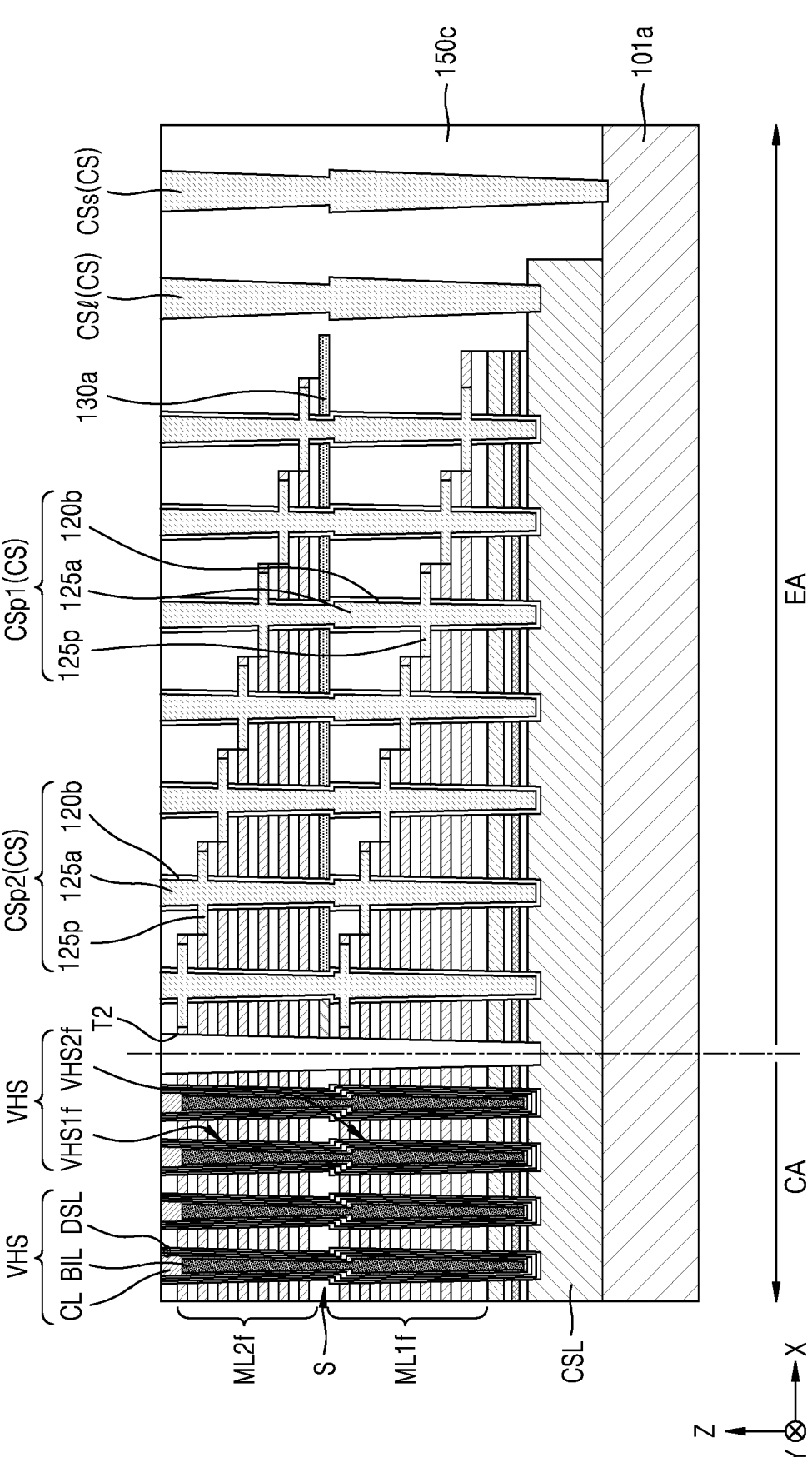
FIGS. 8A to 8E are cross-sectional views illustrating operations of manufacturing the vertical nonvolatile memory device in FIG. 4 according to some embodiments of inventive concepts.

Referring to FIG. 8A, a contact formation sacrificial layer CS used to form a contact may be formed through the first and second mold structures ML1*f* and ML2*f* or through the planar insulating layer 150*c* in the extension area EA by the same operations as described with reference to FIGS. 5A to 5E at first, in a method of manufacturing a vertical nonvolatile memory device according to some embodiments of inventive concepts. Thereafter, a second trench T2 may be formed through the first mold structures ML1*f* and the second mold structures ML2f, until the common source line CSL may be exposed through the second trench T2. The second trench T2 may correspond to the separation area DA in a subsequent operation. Accordingly, a plurality of second trenches T2 may be formed extending in the first direction (X direction) and spaced apart from each other in the second direction (Y direction). The second trench T2 may expose the side surface of the contact separation sacrificial layer 130a, or may not expose the side surface of the contact separation sacrificial layer 130a.

Figure 8B:
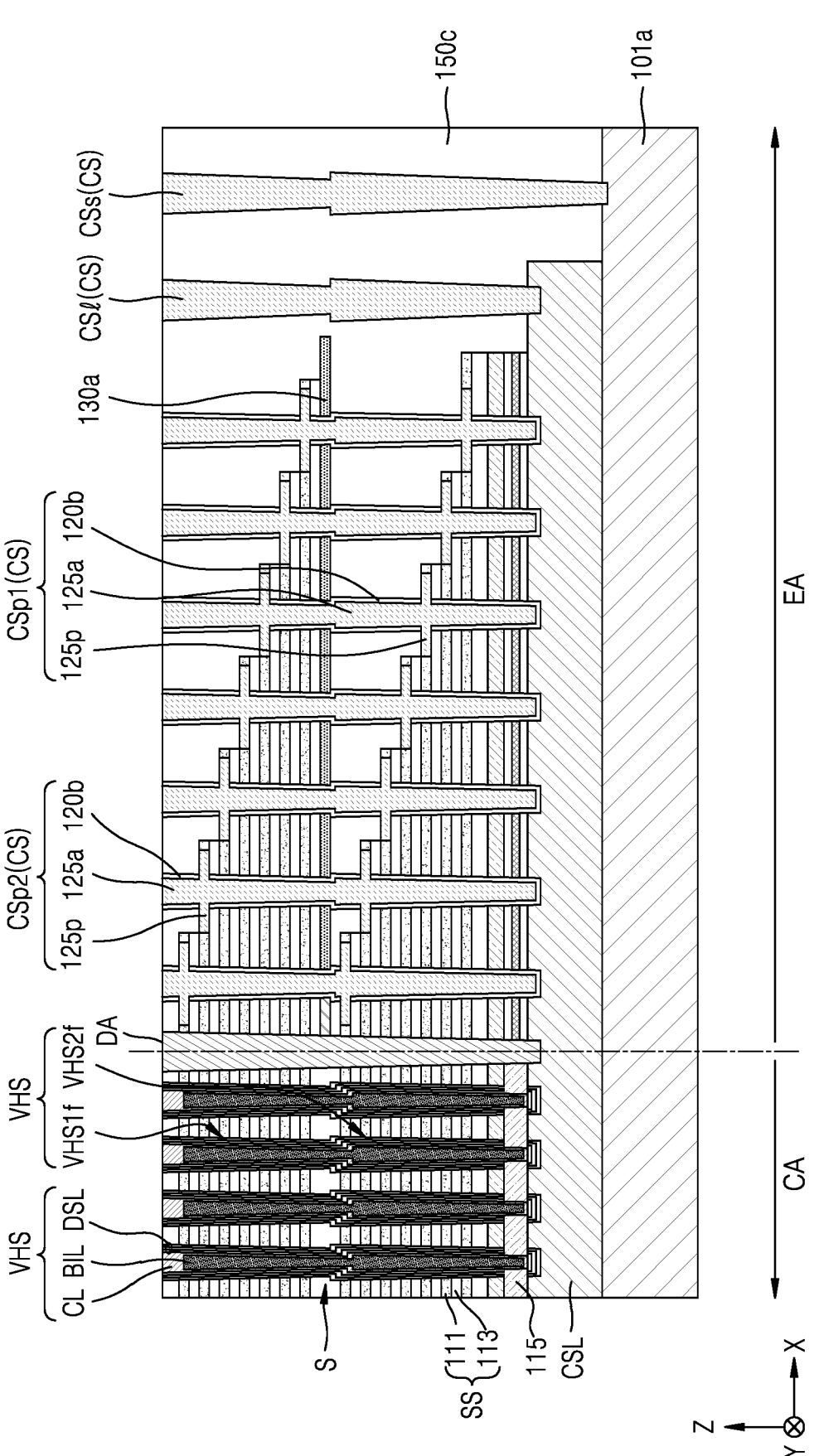

Referring to FIG. 8B, the gate electrode layer 111 may be formed using the second trench T2. Particularly, the sacrificial layer SL exposed through the second trench T2 may be removed and may be replaced with a metal material, for example, tungsten (W), to thereby form a plurality of gate electrode layers 111. The stacked structure SS may be formed by forming the plurality of gate electrode layers 111. After forming the stack structure SS, the second trench T2 may be filled with an insulating material, for example, an oxide, to thereby form the separation area DA.

Figure 8C:
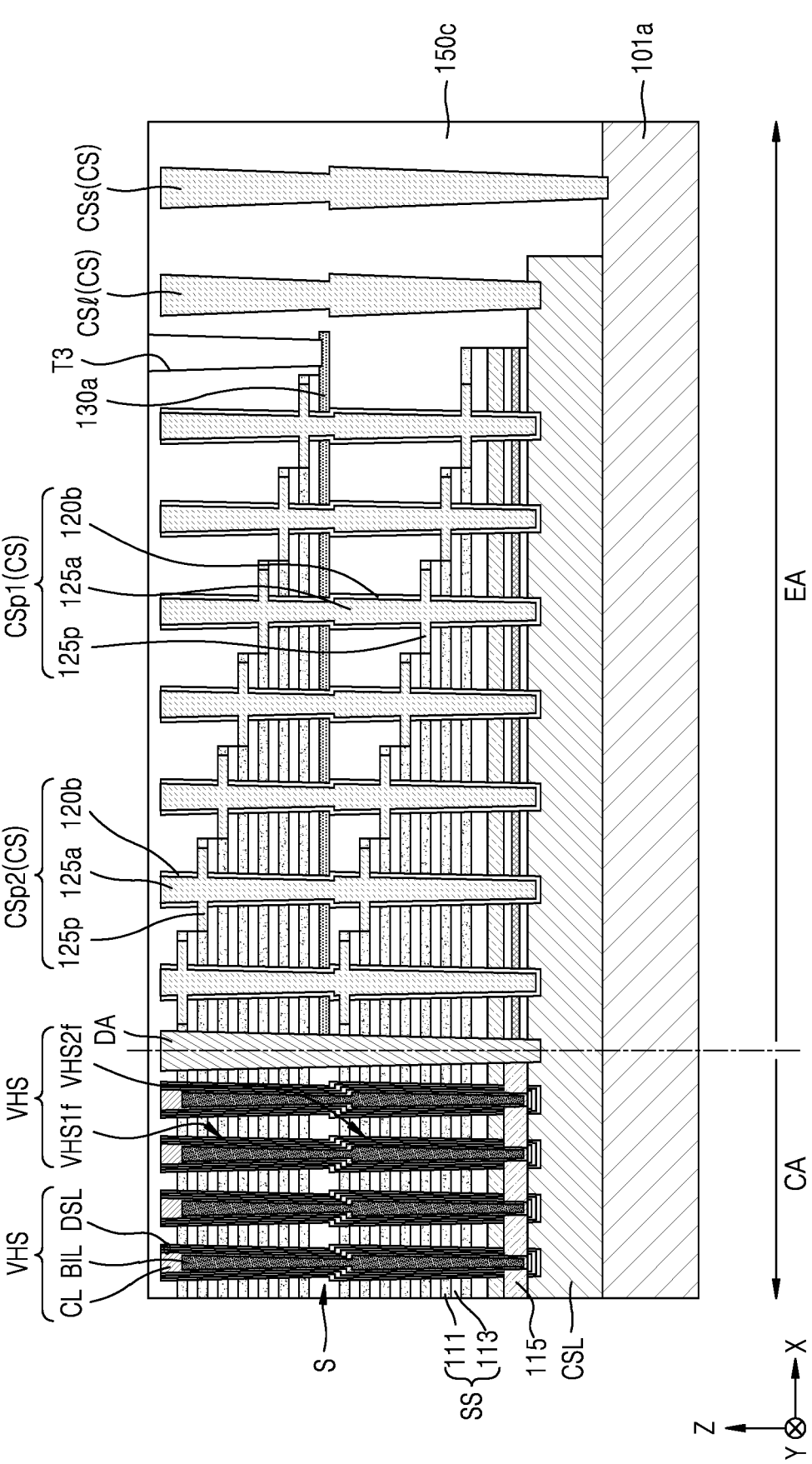

Referring to FIG. 8C, after forming the stack structure SS and the separation area DA, a third trench T3 may be formed exposing the right end portion of the contact separation sacrificial layer 130a in the first direction (X direction). The third trench T3 may be formed through an upper portion of the planar insulating layer 150c.

Figure 8D:
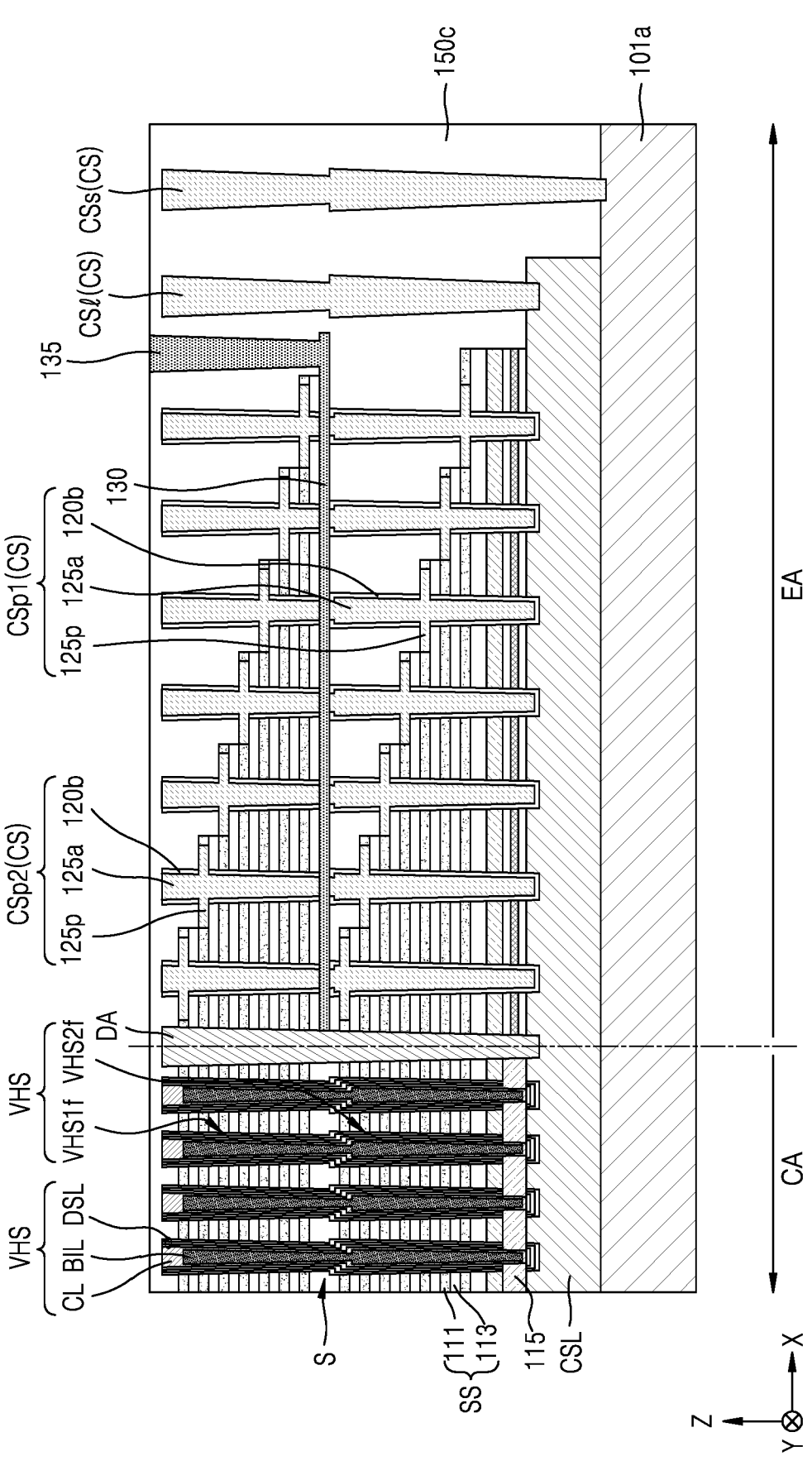

Referring to FIG. 8D, the contact separation layer 130 may be formed using the third trench T3. The contact separation layer 130 may be formed using the third trench T3 using operations that are substantially the same as operations used to form the contact separation layer 130 using the first trench T1, as described with reference to FIGS. 5F to 5L. By forming the contact separation layer 130, the pad contact formation sacrificial layer CSp (used to form a pad contact) may be separated into a first pad contact formation sacrificial layer CSp1 below the contact separation layer 130 and a second pad contact formation sacrificial layer CSp2 on the contact separation layer 130. After forming the contact separation layer 130, an insulating layer (for example, an oxide) may be filled into a residual of the third trench T3, to thereby form the penetrating insulating pattern 135.

Figure 8E:
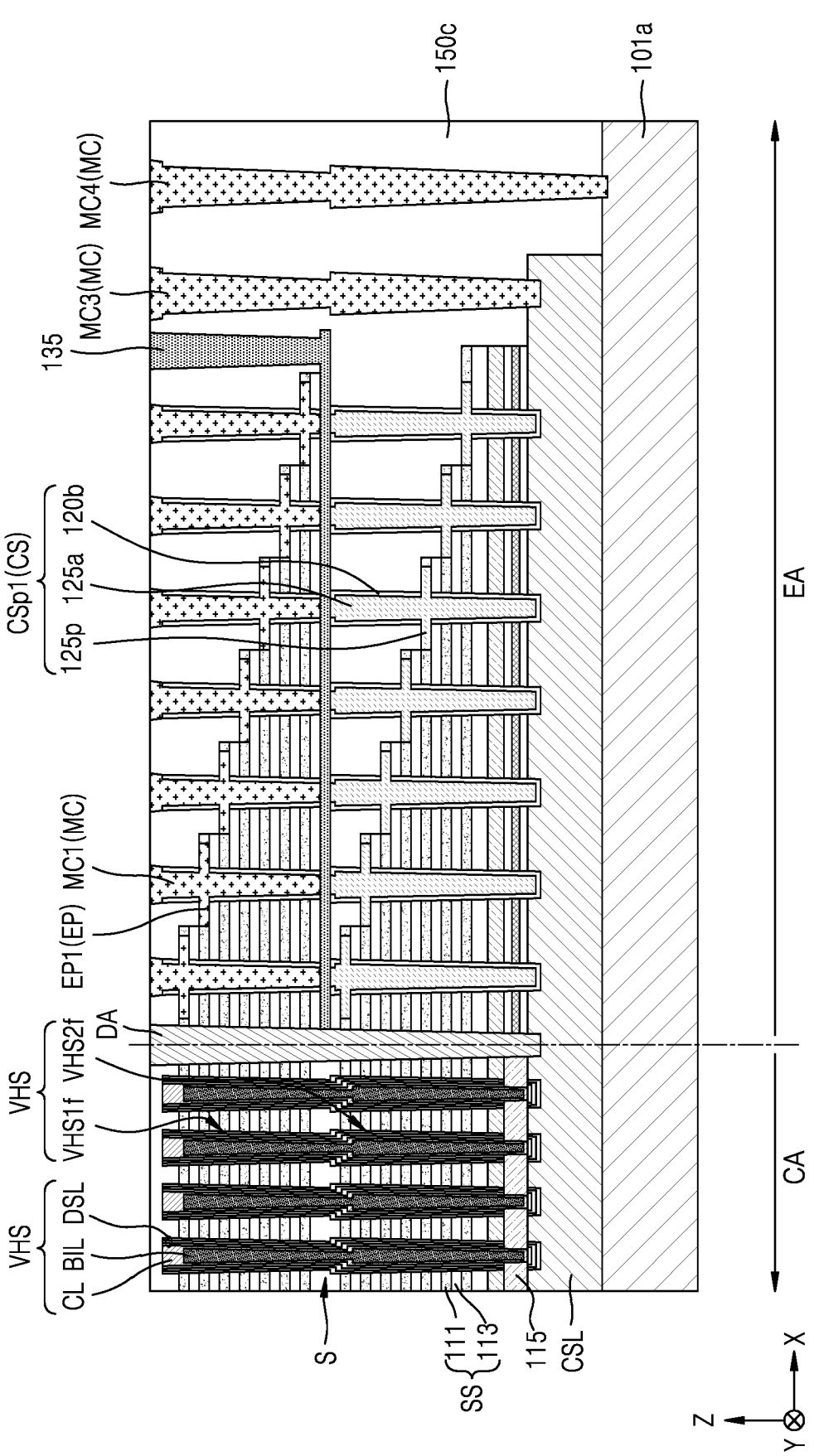

Referring to FIG. 8E, the second pad contact formation sacrificial layer CSp2, the line contact formation sacrificial layer CSl, and the substrate contact formation sacrificial layer CSs may be opened, the buried sacrificial layer 125 may be removed, and a metal material (such as tungsten W) may be filled therein to form the first metal contact MC1, the third metal contact MC3, and the fourth metal contact MC4. The first electrode pad EP1 may also be formed when forming the first metal contact MC1. Thereafter, the vertical nonvolatile memory device 100b in FIG. 4 may be manufactured by the same operations as described with reference to FIGS. 5P to 5U.

Up to now, some embodiments of inventive concepts have been described with reference to the embodiments shown in the drawings, but this is only by way of example, and it will be understood by those skilled in the art that various modifications and equivalent other embodiments are possible therefrom. Therefore, the true scope of protection of the present inventive concepts should be determined by the technical spirit of the appended claims.

While some embodiments of inventive concepts have been particularly shown and described with reference to examples thereof, it will be understood that various changes in form and details may be made therein without departing from the spirit and scope of the following claims.

What is claimed is:

1. A vertical non-volatile memory device, comprising:
a substrate including a cell array area and an extension area adjacent to the cell array area and extending in a first direction parallel with respect to a face of the substrate, wherein a second direction extends parallel with respect to the face of the substrate and orthogonal with respect to the first direction;
a vertical channel structure extending away from the substrate in a third direction and having a first floor vertical channel structure and a second floor vertical channel structure, wherein the first floor vertical channel structure is between the second floor vertical channel structure and the substrate, and wherein the third direction is orthogonal with respect to the first and second directions;
a stacked structure on the substrate, wherein the stacked structure includes gate electrode layers and interlayer insulating layers alternately stacked along a side wall of the vertical channel structure;
a separation area extending in the first direction through the cell array area and/or the extension area and separating block units of the cell array area and/or the extension area in the second direction;
a plurality of electrode pads extending in the first direction from respective ones of the gate electrode layers and arranged in a step structure in the extension area; and
a contact separation layer extending in a direction that is parallel with respect to the first and second directions in the extension area, wherein the contact separation layer is at a distance from the substrate that is equivalent to a distance from the substrate to a transition between the first floor and second floor vertical channel structures; and
first metal contacts extending in the third direction and connected to the plurality of electrode pads in the extension area, wherein the contact separation layer separates the first metal contacts into first lower metal contacts between the substrate and the contact separation layer and first upper metal contacts with the contact separation layer between the first upper metal contacts and the substrate, and
wherein at least one metal contact of the first lower metal contacts and the first upper metal contacts is in contact with the contact separation layer.

2. The vertical non-volatile memory device of claim 1, wherein the plurality of electrode pads include upper electrode pads with the contact separation layer between the upper electrode pads and the substrate and lower electrode pads between the contact separation layer and the substrate,
wherein the first lower metal contacts are respectively connected to the lower electrode pads, and
wherein the first upper metal contacts are respectively connected to the upper electrode pads.

3. The vertical non-volatile memory device of claim 2, wherein the step structure includes a first step structure of the lower electrode pads and a second step structure of the upper electrode pads,
wherein the first step structure is arranged so that each of the lower electrode pads has a respective distance from the substrate so that a distance of each of the lower electrode pads from the substrate increases with increasing distance of the lower electrode pads from the cell array area, and wherein the second step structure is arranged so that each of the upper electrode pads has a respective distance from the substrate so that a distance of each of the lower electrode pads from the substrate increases with increasing distance of the lower electrode pads from the cell array area.

4. The vertical non-volatile memory device of claim 2, wherein a lowermost electrode pad among the lower electrode pads and a lowermost electrode pad among the upper electrode pads are aligned in the third direction, and wherein an uppermost electrode pad among the lower electrode pads and an uppermost electrode among the upper electrode pads are aligned in the third direction.

5. The vertical non-volatile memory device of claim 2, wherein each of the first lower metal contacts is aligned with a respective one of the first upper metal contacts in the third direction.

6. The vertical non-volatile memory device of claim 1, further comprising:

a plurality of second metal contacts in the extension area and spaced apart from the contact separation layer, wherein each of the plurality of second metal contacts is connected to a corresponding one of the first upper metal contacts by an upper wiring such that each of the plurality of second metal contacts and the corresponding one of the first upper metal contacts is between the respective upper wiring and the substrate.

7. The vertical non-volatile memory device of claim 1, wherein widths of respective surfaces of one of the first lower metal contacts and a corresponding one of the first upper metal contacts at the contact separation layer are substantially identical.

8. The vertical non-volatile memory device of claim 1, wherein the contact separation layer is in contact with the separation area at a distance from the substrate that is equivalent to the distance from the substrate to the transition between the first floor and second floor vertical channel structures.

9. The vertical non-volatile memory device of claim 1, further comprising:

a penetrating insulating pattern having a length in the third direction that is identical to that of the first lower metal contacts, wherein the penetrating insulating pattern is connected to an end portion of the contact separation layer spaced apart from the cell array area in the first direction.

10. The vertical non-volatile memory device of claim 1, wherein the vertical channel structure, the stacked structure, the separation area, the plurality of electrode pads, the first metal contacts and the contact separation layer are on an upper chip, wherein the substrate and a peripheral circuit area of the substrate are on a lower chip, and wherein the lower chip and the upper chip are joined by a hybrid bond.

11. A vertical non-volatile memory device, comprising:

a substrate wherein a cell array area and an extension area are defined on the substrate, and wherein first and second orthogonal directions are defined as being parallel with respect to a surface of the substrate;

a vertical channel structure extending in a third direction from the cell array area of the substrate, wherein the vertical channel structure has a first floor vertical channel structure and a second floor vertical channel structure, and wherein the third direction is orthogonal with respect to the surface of the substrate;

a stacked structure on the cell array area of the substrate and including gate electrode layers and interlayer insulating layers alternately stacked along a side wall of the vertical channel structure;

a plurality of electrode pads extending from respective ones of the gate electrode layers in the first direction, and arranged in a step structure in the extension area;

a contact separation layer extending in the first direction in the extension area at a distance from the substrate that is equivalent to a distance from the substrate to a transition between the first floor and second floor vertical channel structures; and a plurality of metal contacts extending in the third direction and connected to electrode pads in the extension area, wherein the contact separation layer separates the plurality of metal contacts into lower metal contacts and upper metal contacts, wherein at least one metal contact of the lower metal contacts and the upper metal contacts is in contact with the contact separation layer, and wherein the electrode pads include upper electrode pads connected to respective ones of the upper metal contacts and lower electrode pads connected to respective ones of the lower metal contacts, wherein the contact separation layer is between the lower and upper electrode pads, wherein each of the upper electrode pads has a respective distance from the substrate so that a distance of each of the upper electrode pads from the substrate increases with increasing distance from the cell array area, and wherein each of the lower electrode pads has a respective distance from the substrate so that a distance of each of the lower electrode pads from the substrate increases with increasing distance from the cell array area.

12. The vertical non-volatile memory device of claim 11, wherein an uppermost one of the lower electrode pads and an uppermost one of the upper electrode pads are aligned in the third direction.

13. The vertical non-volatile memory device of claim 11, wherein each of the upper metal contacts is connected to a respective wiring layer on the substrate by a connection contact in the extension area, wherein the connection contact is spaced apart from the contact separation layer in the first direction.

14. The vertical non-volatile memory device of claim 11, wherein the contact separation layer is in contact with at least one of a separation area and a penetrating insulating pattern at the distance from the substrate that is equivalent to the distance from the substrate to the transition between the first floor and the second floor vertical channel structures.

15. The vertical non-volatile memory device of claim 11, wherein a cell on peri (COP) structure is provided.

16. A non-volatile memory device comprising:

a substrate wherein a first direction is orthogonal with respect to a surface of the substrate and wherein the substrate includes a cell array area and an extension area;

a first gate structure layer on the substrate, wherein the first gate structure layer includes a plurality of first gate layers;

a contact separation layer on the first gate structure layer on the extension area;

a second gate structure layer on the first gate structure layer and on the contact separation layer, wherein the second gate structure layer includes a plurality of second gate layers;

a plurality of channel structures extending in the first direction through the first and second gate structure layers on the cell array area;

a plurality of first metal contacts extending through the first gate structure layer in the first direction between the substrate and the contact separation layer in the extension area;

a plurality of second metal contacts extending through the second gate structure layer in the first direction in the extension area to contact the contact separation layer, wherein the contact separation layer is between the plurality of first metal contacts and the plurality of second metal contacts, and wherein each of the plurality of second metal contacts is aligned with a respective one of the plurality of first metal contacts in the first direction;

a plurality of first electrode pads, wherein each of the plurality of first electrode pads extends from a sidewall of a respective one of the plurality of first metal contacts to provide electrical coupling with a respective one of the plurality of first gate layers of the first gate structure layer; and a plurality of second electrode pads, wherein each of the plurality of second electrode pads extends from a sidewall of a respective one of the plurality of second metal contacts to provide electrical coupling with a respective one of the plurality of second gate layers of the second gate structure layer.

17. The non-volatile memory device of claim 16 further comprising:

an insulating layer on portions of the extension area of the substrate extending beyond the first and second gate structure layers; and a plurality of third metal contacts extending through the insulating layer in the extension area and spaced apart from the first and second gate structure layers and spaced apart from the contact separation layer.

18. The non-volatile memory device of claim 17, further comprising:

wiring providing electrical coupling between at least one of the plurality of second metal contacts and at least one of the plurality of third metal contacts, wherein the at least one of the plurality of second metal contacts and the at least one of the plurality of third metal contacts are between the wiring and the substrate.

19. The non-volatile memory device of claim 16, wherein a first of the plurality of first electrode pads is closer to the cell array area than a second of the plurality of first electrode pads, and wherein the first of the plurality of first electrode pads is closer to the substrate than the second of the plurality of first electrode pads.

20. The non-volatile memory device of claim 16, wherein the first gate structure layer includes a plurality of first interlayer insulating layers, wherein each of the plurality of first interlayer insulating layers is between two of the plurality of first gate layers, wherein the second gate structure layer includes a plurality of second interlayer insulating layers, and wherein each of the plurality of second interlayer insulating layers is between two of the plurality of second gate layers.

* * * * *